US009142455B2

(12) United States Patent
Kim et al.

(10) Patent No.: US 9,142,455 B2
(45) Date of Patent: Sep. 22, 2015

(54) METHOD OF FABRICATING SEMICONDUCTOR DEVICE

(71) Applicants: Kyoungmi Kim, Gyeonggi-do (KR); Myung-Sun Kim, Gyeonggi-do (KR); Jaeho Kim, Gyeonggi-do (KR); Hyounghee Kim, Gyeonggi-do (KR); Namuk Choi, Gyeonggi-do (KR); Jungsik Choi, Gyeonggi-do (KR)

(72) Inventors: Kyoungmi Kim, Gyeonggi-do (KR); Myung-Sun Kim, Gyeonggi-do (KR); Jaeho Kim, Gyeonggi-do (KR); Hyounghee Kim, Gyeonggi-do (KR); Namuk Choi, Gyeonggi-do (KR); Jungsik Choi, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/277,330

(22) Filed: May 14, 2014

(65) Prior Publication Data
US 2015/0024587 A1 Jan. 22, 2015

(30) Foreign Application Priority Data
Jul. 22, 2013 (KR) .................. 10-2013-0086211

(51) Int. Cl.
H01L 21/768 (2006.01)
H01L 21/027 (2006.01)

(52) U.S. Cl.
CPC ...... *H01L 21/76879* (2013.01); *H01L 21/0274* (2013.01); *H01L 21/76807* (2013.01)

(58) Field of Classification Search
CPC .................................................. G03F 7/2022
USPC ................................................. 438/381, 618
See application file for complete search history.

(56) References Cited

U.S. PATENT DOCUMENTS

| 6,905,621 | B2 * | 6/2005 | Ho et al. ........................ 216/47 |
| 7,786,020 | B1 | 8/2010 | Kang et al. |
| 8,313,998 | B2 | 11/2012 | Satonaka et al. |
| 8,338,956 | B2 | 12/2012 | Maeda |
| 8,492,824 | B2 | 7/2013 | Yahashi |
| 8,835,100 | B2 * | 9/2014 | Yang ............................ 430/312 |
| 2009/0317978 | A1 | 12/2009 | Higashi |
| 2010/0039865 | A1 * | 2/2010 | Kidoh et al. ............. 365/185.23 |
| 2011/0241000 | A1 * | 10/2011 | Choi et al. ...................... 257/59 |

(Continued)

FOREIGN PATENT DOCUMENTS

| JP | 2011060958 | 3/2011 |
| KR | 1020100127718 | 12/2010 |

(Continued)

*Primary Examiner* — Yu-Hsi D Sun
*Assistant Examiner* — Chi-Hua Yang
(74) *Attorney, Agent, or Firm* — F. Chau & Associates, LLC

(57) ABSTRACT

A method of fabricating a semiconductor device is provided. An etch-target layer is formed on a substrate. A photoresist layer is formed on the etch-target layer. A first exposure process is performed using a first photo mask to form a plurality of first-irradiated patterns in the photoresist layer. The first photo mask includes a plurality of first transmission regions. Each first transmission region has different optical transmittance. A second exposure process is performed using a second photo mask to form a plurality of second-irradiated patterns in the photoresist layer. The second photo mask includes a plurality of second transmission regions. Each second transmission region has different optical transmittance. A photoresist pattern is formed from the photoresist layer by removing the plurality of first-irradiated and second-irradiated patterns from the photoresist layer. A lower structure is formed from the etch-target layer by etching the etch-target layer using the photoresist pattern.

15 Claims, 41 Drawing Sheets

(56) References Cited

U.S. PATENT DOCUMENTS

| | | | |
|---|---|---|---|
| 2011/0284946 A1 | 11/2011 | Kiyotoshi | |
| 2011/0300712 A1* | 12/2011 | Kim et al. | 438/703 |
| 2012/0187471 A1 | 7/2012 | Yu et al. | |
| 2013/0122403 A1* | 5/2013 | Kim et al. | 430/5 |
| 2013/0161821 A1* | 6/2013 | Hwang et al. | 257/773 |
| 2013/0228848 A1* | 9/2013 | Nansei | 257/324 |

FOREIGN PATENT DOCUMENTS

| | | |
|---|---|---|
| KR | 1020110001691 | 1/2011 |
| KR | 1020110119896 | 11/2011 |
| KR | 1020120035399 | 4/2012 |

* cited by examiner

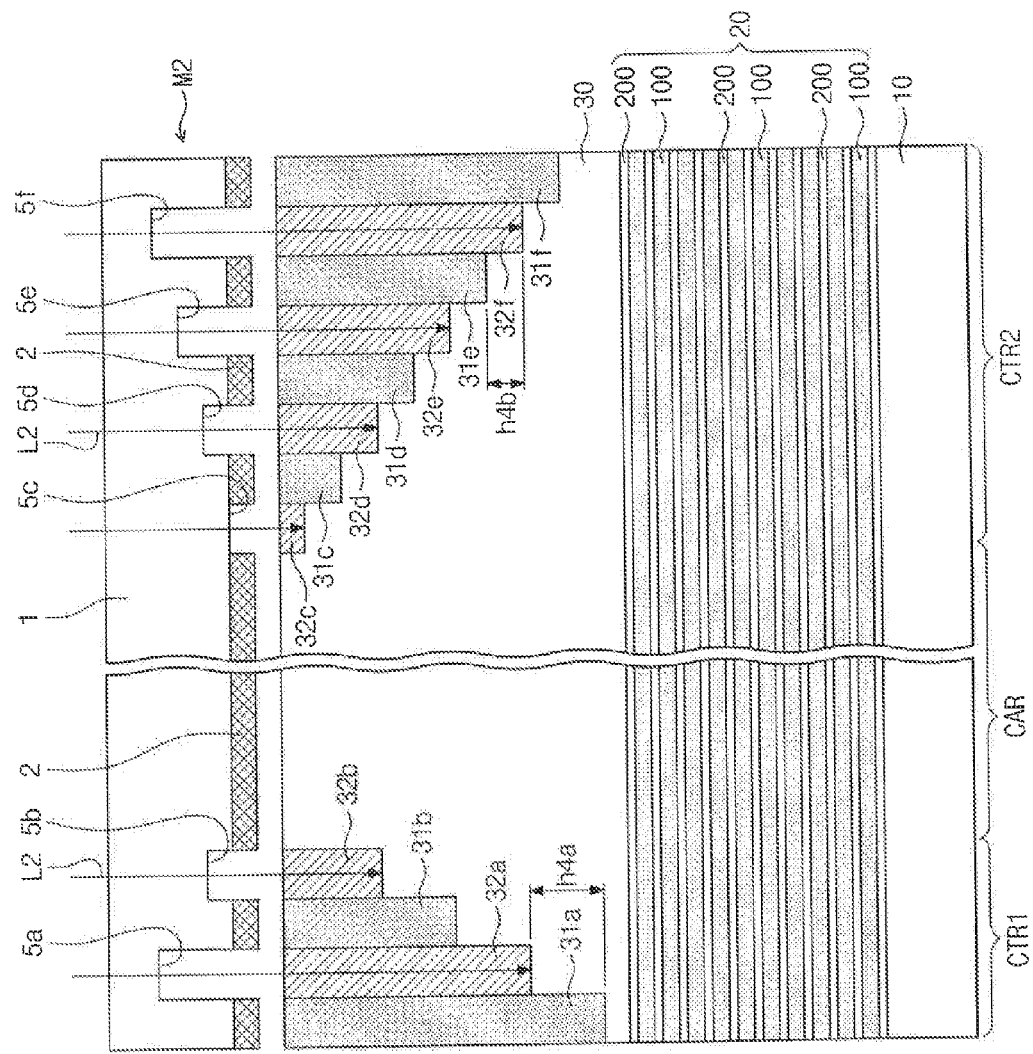

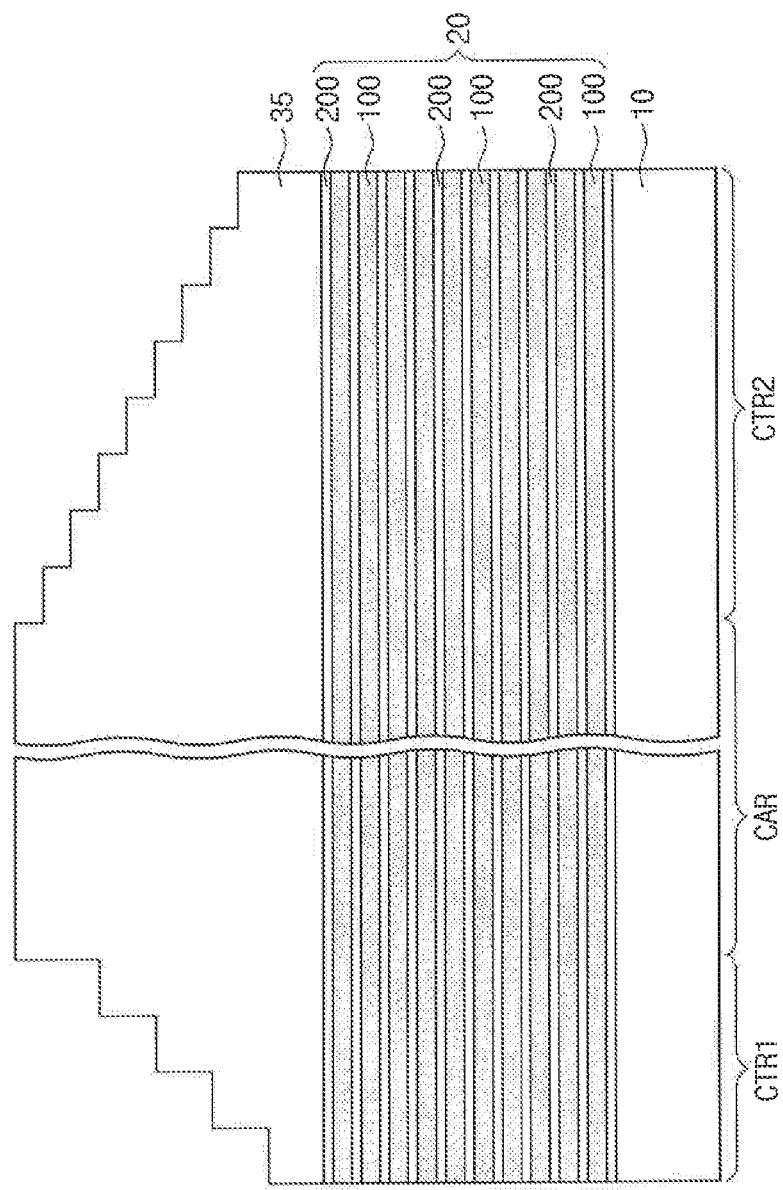

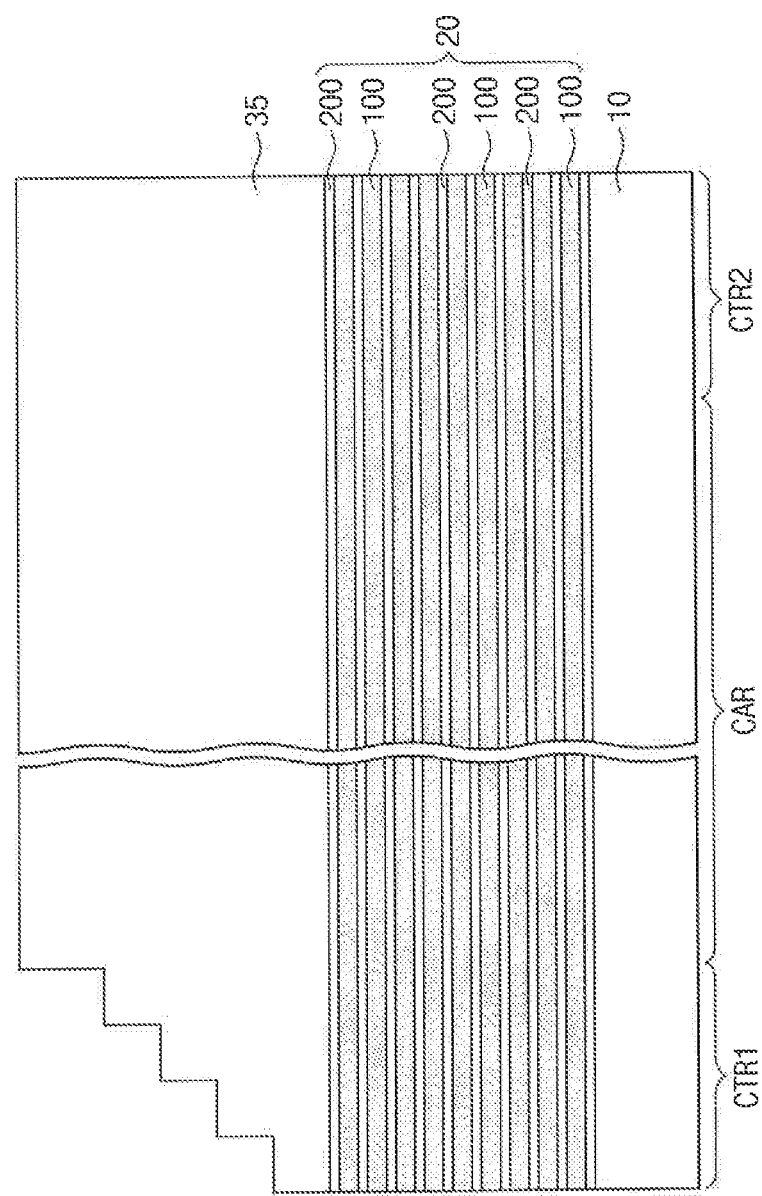

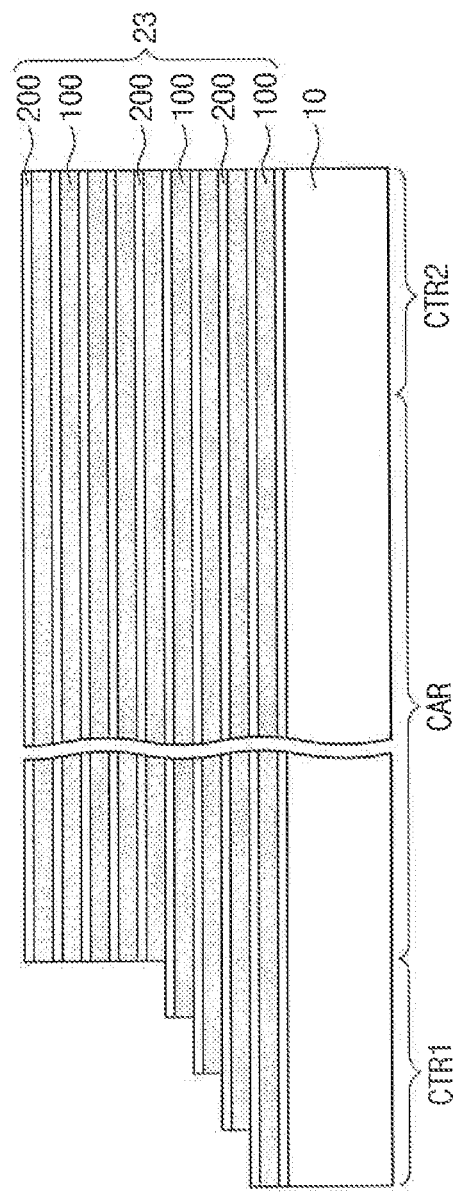

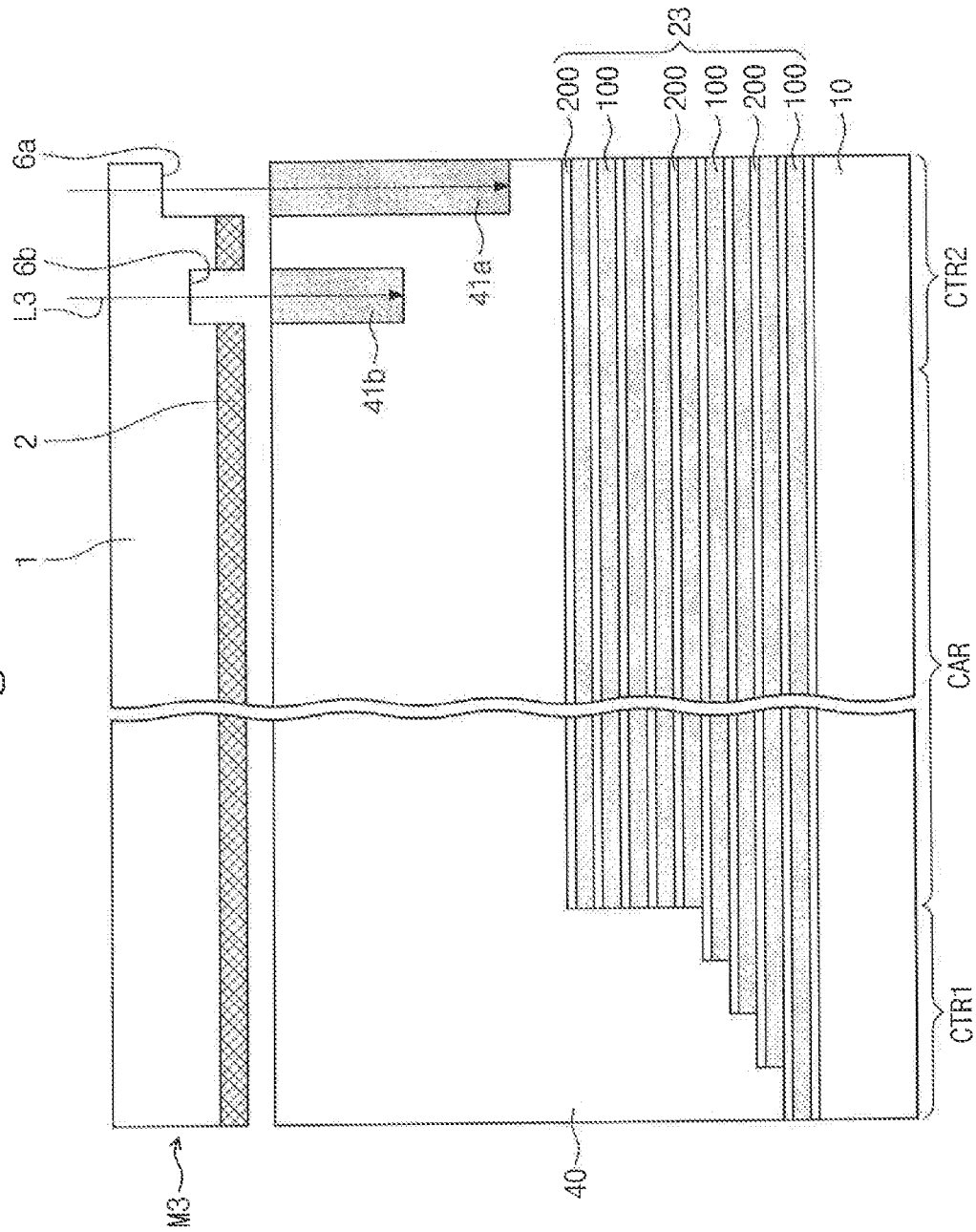

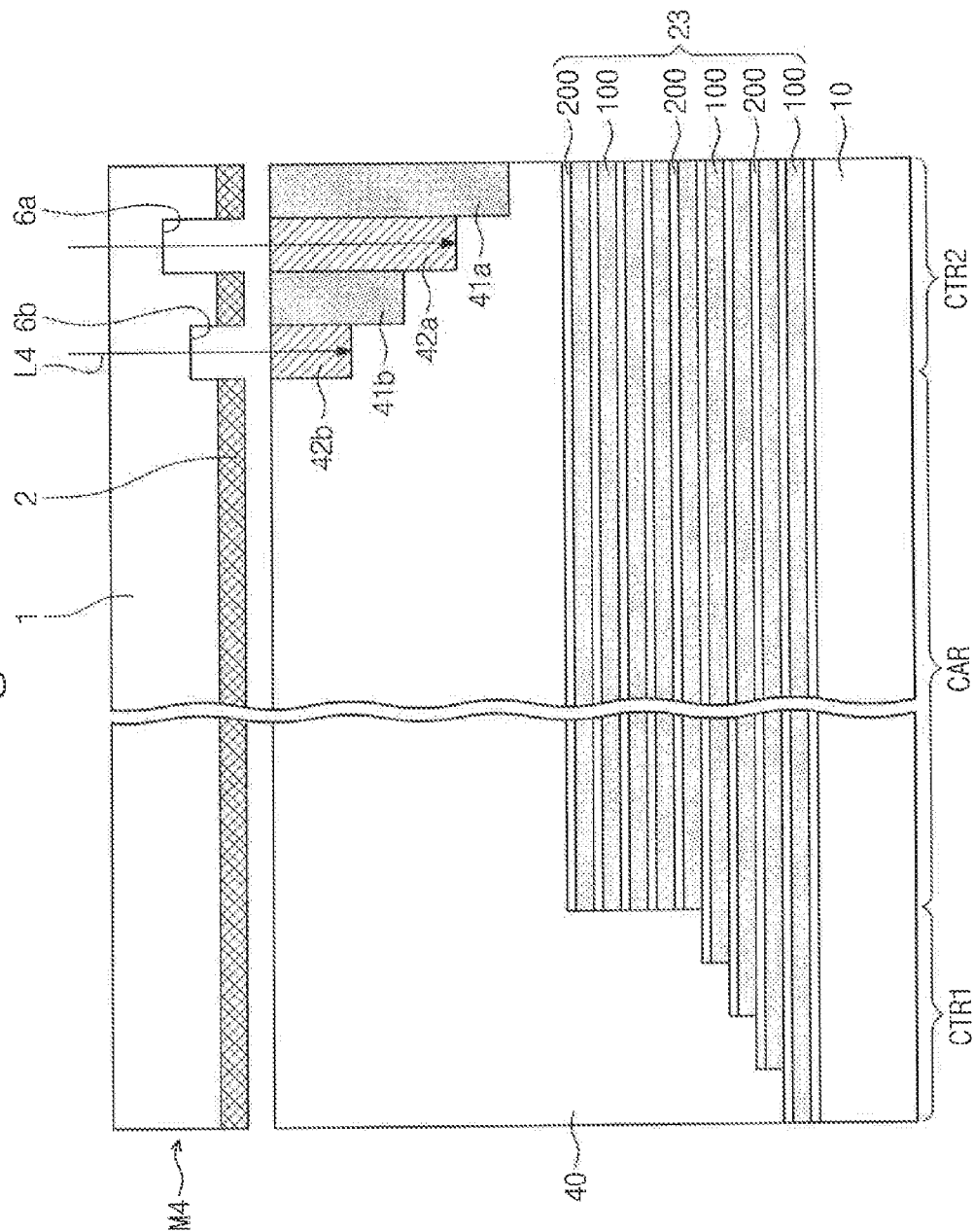

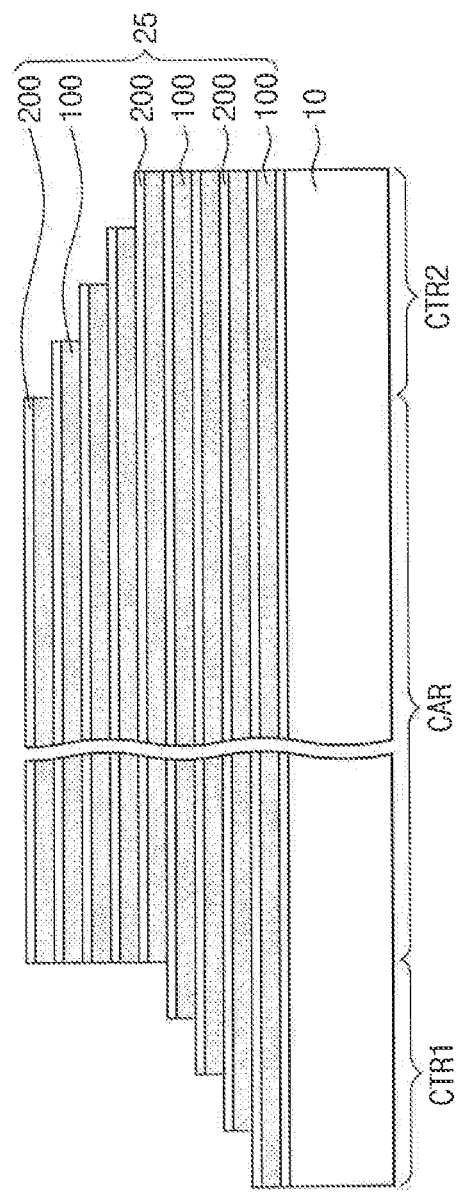

METHOD OF FABRICATING SEMICONDUCTOR DEVICE

CROSS-REFERENCE TO RELATED APPLICATION

This application claims priority under 35 U.S.C. §119 to Korean Patent Application No. 10-2013-0086211, filed on Jul. 22, 2013, in the Korean Intellectual Property Office, the disclosure of which is incorporated by reference herein in its entirety.

TECHNICAL FIELD

The present inventive concept relates to a method of fabricating a semiconductor device.

DISCUSSION OF RELATED ART

Recently, three-dimensional semiconductor devices have been proposed to more densely integrate functional units in a unit area. Three-dimensional semiconductor devices are fabricated using a large number of process steps compared to two-dimensional devices.

SUMMARY

According to an exemplary embodiment of the present inventive concept, a method of fabricating a semiconductor device is provided. An etch-target layer is formed on a substrate, A photoresist layer is formed on the etch-target layer. A first exposure process is performed using a first photo mask to form a plurality of first-irradiated patterns in the photoresist layer. The first photo mask includes a plurality of first transmission regions. Each first transmission region has different optical transmittance. A second exposure process is performed using a second photo mask to form a plurality of second-irradiated patterns in the photoresist layer. The second photo mask includes a plurality of second transmission regions. Each second transmission region has different optical transmittance. A photoresist pattern is formed from the photoresist layer by removing the plurality of first-irradiated and second-irradiated patterns from the photoresist layer. A lower structure is formed from the etch-target layer by etching the etch-target layer using the photoresist pattern.

According to an exemplary embodiment of the present inventive concept, a method of fabricating a semiconductor device is provided. An etch-target layer is formed on a substrate. A photoresist layer is formed on the etch-target layer. A first exposure process is performed on the photoresist layer using a first photo mask to form a plurality of firstly-irradiated patterns in the photoresist layer. Each firstly-irradiated pattern is different in height. A second exposure process is performed on the photoresist layer using a second photo mask to form a plurality of secondly-irradiated patterns. Each second-irradiated patterns is different in height. Each firstly-irradiated patterns and each second-irradiated patterns are alternately arranged. A photoresist pattern is formed from the photoresist layer by removing the plurality of firstly-irradiated and second-irradiated patterns from the photoresist layer. A lower structure is formed from the etch-target layer by etching the etch-target layer using the photoresist pattern.

A first interconnection line having a first width is formed on a substrate. An insulating layer is formed on the first interconnection line. A photoresist layer is formed on the insulating layer. A first T-shaped pattern is formed in the photoresist layer. A second T-shaped pattern is formed in the insulating layer by performing a single anisotropic etching process using the photoresist layer having the first T-shape pattern. A bottom of the T-shaped pattern exposes the first interconnection line. A conductive material is formed to fill the second T-shaped pattern of the insulating layer.

BRIEF DESCRIPTION OF THE DRAWINGS

These and other features of the inventive concept will become more apparent by describing in detail exemplary embodiments thereof with reference to the accompanying drawings of which:

FIGS. 5A through 5D are cross-sectional views illustrating a method of fabricating a semiconductor device according to an exemplary embodiment of the inventive concept;

FIGS. 6A through 6H are cross-sectional views illustrating a method of fabricating a semiconductor device according to an exemplary embodiment of the inventive concept;

DETAILED DESCRIPTION OF EXEMPLARY EMBODIMENTS

Figure 1A:
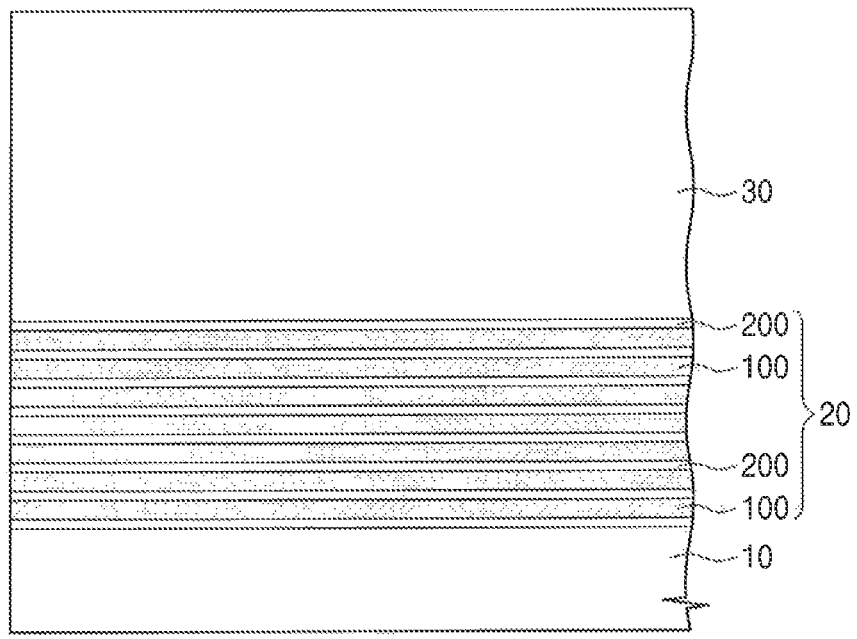
FIGS. 1A through 1E are cross-sectional views illustrating a method of fabricating a semiconductor device according to an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present it will also be understood that when an element is referred to as being "coupled to" or "connected to" another element, it may be directly coupled to or connected to the other element, or intervening elements may also be present. Like reference numerals may refer to the like elements throughout the specification and drawings.

FIGS. 1A through 1E are cross-sectional views illustrating a method of fabricating a semiconductor device, according to an exemplary embodiment of the inventive concept.

Referring to FIG. 1A, an etch-target layer 20 is formed on a substrate 10. The substrate 10 may include a semiconductor material (e.g., a silicon wafer), an insulating material (e.g., a glass), or a semiconductor or conductive material covered with an insulating material. The etch-target layer 20 may include a plurality of vertically-stacked layers, The etch-target layer 20 may be formed by alternately and repeatedly depositing two different layers. One layer may have etch selectivity with respect to another. For example, the etch-target layer 20 includes horizontal layers 100 and interlayered insulating layers 200 alternately stacked on the substrate 10. Here, the horizontal layers 100 may be formed of a material having etch selectivity with respect to interlayered insulating layers 200. For example, the interlayered insulating layers 200 may be a silicon oxide layer, and the horizontal layers 100 may include at least one of a silicon nitride layer, a silicon oxynitride layer, a poly silicon layer, and metal layers, The horizontal layers 100 may be formed of substantially the same material as each other.

The etch-target layer 20 may be formed of a single layer or a plurality of stacked layers. For example, the etch-target layer 20 may include a plurality of vertically-stacked insulating layers and conductive or semiconductor patterns inter-posed between the vertically-stacked insulating layers.

Referring to FIG. 1A, a photoresist layer 30 is coated on the etch-target layer 20. The photoresist layer 30 may be formed by a spin-on coating process. The photoresist layer 30 may be formed to have a thickness greater than that of the etch-target layer 20. The photoresist layer 30 may be a positive-type photoresist. For example, light-receiving portions (e.g., irradiated patterns) of the photoresist layer 30 are selectively removed using a developing solution. The photoresist layer 30 may include a photo-acid generator (PAG). For example, the positive-type photoresist may include a resist film for 248 nm KrF excimer laser, for 193 nm ArF excimer laser, for 157 nm F2 excimer laser, and/or for 13.5 nm extreme ultraviolet (EUV). In addition, the photo-acid generator (PAG) may include a chromophore group which becomes acidic by absorbing a 248 nm KrF excimer laser, a 193 nm ArF excimer laser, or a 157 nm F2 excimer laser.

After the formation of the photoresist layer 30 on the etch-target layer 20, a soft bake process may be performed to the resulting structure. For example, the soft bake process may be performed at a temperature ranging between about 110° C. and about 120° C. for a duration of about 1 minutes to about 5 minutes. The soft bake process may increase hardness and adhesive strength of the photoresist layer 30.

Figure 1B:
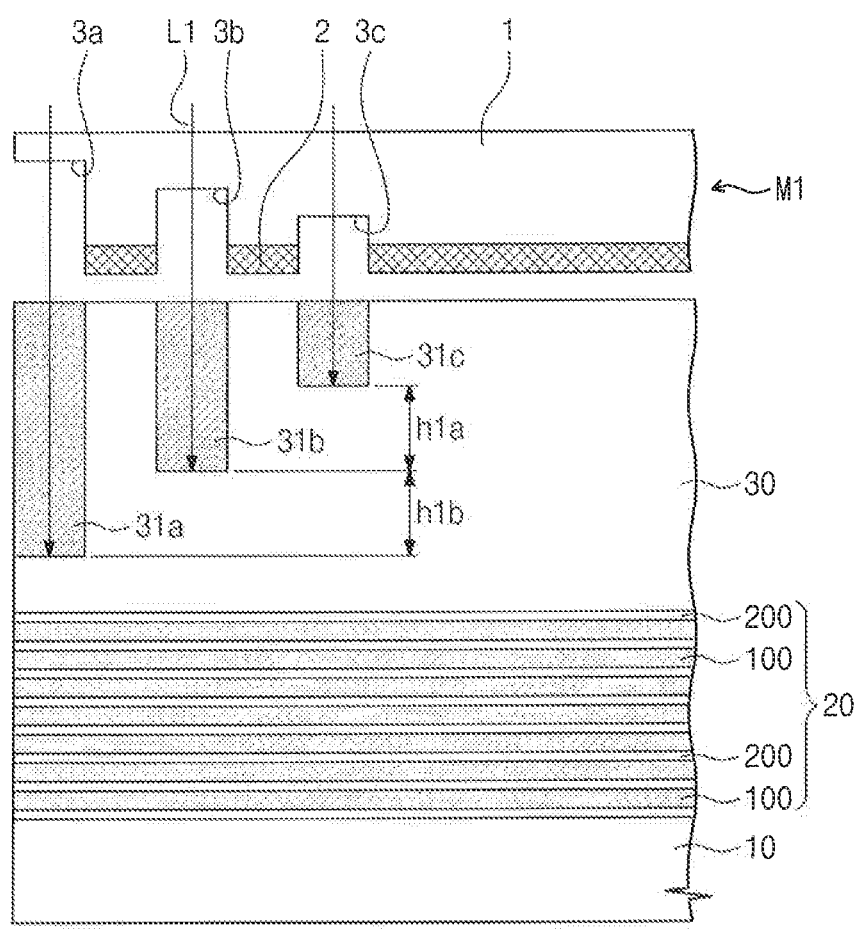

Referring to FIG. 1B, a first exposure process is performed using a first photo mask M1 to form firstly-irradiated patterns 31a, 31b, and 31c in the photoresist layer 30.

The first photo mask M1 includes a mask substrate 1, light-blocking patterns 2 on the mask substrate 1, and a plurality of transmission regions 3a, 3b, and 3c defined by the light-blocking patterns 2.

The mask substrate 1 may include a quartz- or silica-based glass.

The light-blocking patterns 2 may be formed of an opaque material that substantially prevents incident light L1 from passing through the mask substrate 1. The light-blocking patterns 2 may include at least one of metals, silicon-containing metals, and metals containing silicon, oxygen, and nitrogen. For example, the light-blocking patterns 2 may include Cr, Ta, MoSi, MoSiN, MoSiCN, MoSiON, and/or MoSiCON.

The transmission regions 3a, 3b, and 3c may have optical transmittance different from each other. For example, the transmission regions 3a, 3b, and 3c have thickness different from each other. The variations in thickness of the mask substrate 1 may lead to spatial differences in optical transmittance or intensity of light to be incident into the photoresist layer 30. Further, the transmission regions 3a, 3b, and 3c are spaced apart from each other such that optical interference between the incident light L1 passing through the transmission regions 3a, 3b and 3c is prevented.

The mask substrate 1 of the first photo mask M1 includes first to third transmission regions 3a, 3b and 3c defined by the light-blocking patterns 2. The thickness of the mask substrate 1 is smaller at the first transmission region 3a than at the second transmission region 3b and is greater at the third transmission region 3c than at the second transmission region 3b. For the convenience of a description, three transmission regions (for example, 3a, 3b, and 3c) are illustrated, but the mask substrate 1 may include greater or less than three transmission regions.

In the first exposure process using the first photo mask M1, the transmittance of the incident light L1 may increase as the thickness of the mask substrate 1 decreases. For example, the transmittance of the mask substrate 1 may be higher at the first transmission region 3a than at the second and third transmission regions 3b and 3c. Further, the transmittance of the mask substrate 1 may be lower at the third transmission region 3c than at the first and second transmission regions 3a and 3b.

The first exposure process using the first photo mask M1 forms the firstly-irradiated patterns 31a, 31b, and 31c in the photoresist layer 30. The first exposure process may be performed using the incident light L1 having at least one of a 248 nm KrF excimer laser, a 193 nm ArF excimer laser, a 157 nm F2 excimer laser, and a 13.5 nm EUV.

The incident light L1 is incident into corresponding portions of the photoresist layer 30 through the transmission regions 3a, 3b, and 3c of the first photo mask M1, and then, the incident light L1 may convert the irradiated portions of the photoresist layer 30 to the firstly-irradiated patterns 31a, 31b, and 31c. The firstly-irradiated patterns 31a, 31b and 31c may be selectively removed by a developing solution.

The firstly-irradiated patterns 31a, 31b, and 31c are spaced apart from each other, and heights thereof are different from each other. For example, the incident light L1 passing through the first transmission region 3a has the highest intensity. Thus, the height of the firstly-irradiated pattern 31a is greater than the heights of the firstly-irradiated patterns 31b and 31c associated with the second and third transmission regions 3b and 3c. Further, the incident light L1 passing through the third transmission region 3c has the lowest intensity. Thus, the height of the firstly-irradiated pattern 31c associated with the third transmission region 3c is smaller than the heights of the firstly-irradiated patterns 31a. and 31b associated with the firstly-irradiated patterns 31a and 31b.

The height differences h1a and h1b among the firstly-irradiated patterns 31a, 31b, and 31c may be determined based on the thicknesses of the interlayered insulating layers 200 and the horizontal layers 100. For example, the height difference h1a between two adjacent firstly-irradiated patterns 31b, and 31c may be substantially the same as the height difference h1b between two adjacent firstly-irradiated patterns 31a and 32b.

Figure 1C:
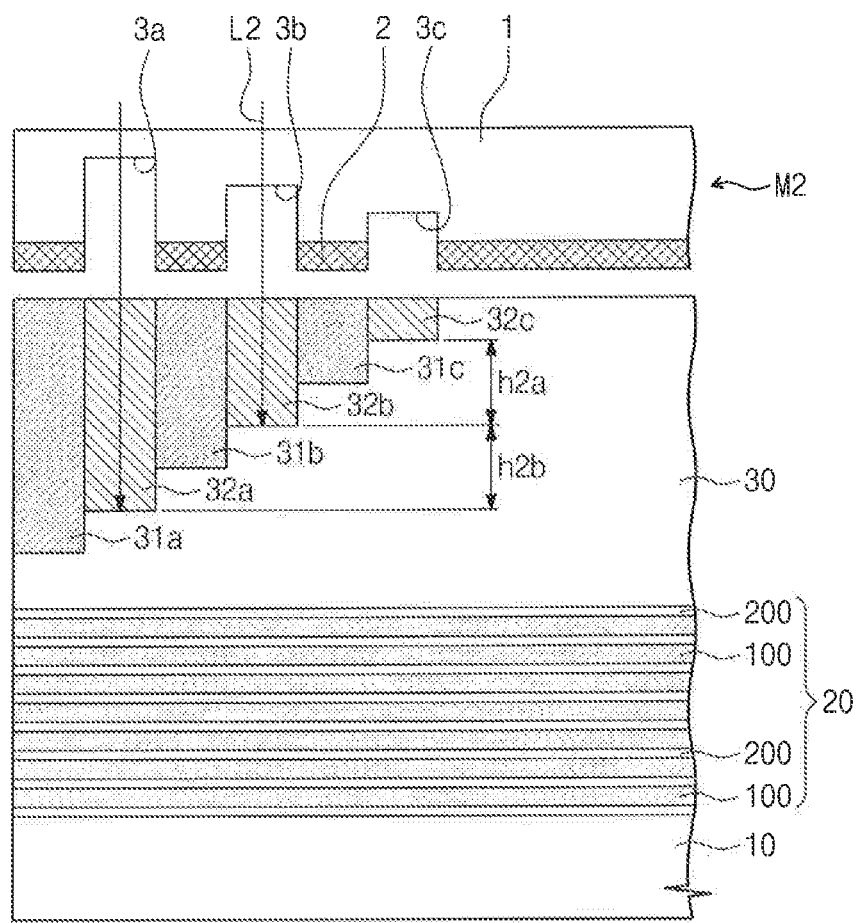

Referring to FIG. 1C, a second exposure process is performed using a second photo mask M2. The second photo mask M2 includes a mask substrate 1 and light-blocking patterns 2 on the mask substrate 1. The mask substrate 1 of the second photo mask M2 includes a plurality of the transmission regions 3a, 3b, and 3c defined by the light-blocking patterns 2. The transmission regions 3a, 3b, and 3c of the second photo mask M2 allows incident light L2 to be incident into portions of the photoresist layer 30 between the firstly-irradiated patterns 31a, 31b, and 31c to form secondly-irradiated patterns 32a, 32b and 32c. Optical transmittance of the transmission regions 3a, 3b, and 3c of the second photo mask M2 in the second exposure process may be lower than the transmission regions 3a, 3b, and 3c of the first photo mask M1 in first exposure process.

For example, the second photo mask M2 includes the first to third transmission regions 3a, 3b, and 3c causing differences in transmittance of the incident light L2. For example, the first to third transmission regions 3a, 3b, and 3c of the second photo mask M2 have different thicknesses from each other.

According to an exemplary embodiment, two different photo masks M1 and M2 are used to form the irradiated patterns 31a to 31c and 32a to 32c of FIG. 1C. Alternatively, the first photo mask M1 may be used for the second photo mask M2. In that case, the first photo mask M1 may be shifted such that the secondly-irradiated patterns 32a, 32b and 32c are formed in the photoresist layer 30. The first photo mask M1 may be reused as the second photo mask M2.

In the second exposure process using the second photo mask M2, secondly-irradiated patterns 32a, 32b, and 32c are formed in the photoresist layer 30. For example, the secondly-irradiated patterns 32a, 32b, and 32c correspond to the transmission regions 3a, 3b and 3c of the second photo mask M2, respectively. The photoresist layer 30 may absorb the incident light L2.

The incident light L2 of the second exposure process has an intensity lower than that of the incident light L1 in the first exposure process. Alternatively, the first and second exposure processes may apply substantially the same light from each other. In that case, the transmission regions 3a, 3b, and 3c of the second photo mask M2 may have different thicknesses from those of the transmission regions 3a, 3b, and 3c of the first photo mask M1.

The secondly-irradiated patterns 32a, 32b, and 32c have different heights from each other. For example, the secondly-irradiated patterns 32a, 32b, and 32c and the firstly-irradiated patterns 31a, 31b, and 31c are alternately formed in a manner that the heights of the patterns 31a to 31c and 32a to 32c are reduced, The secondly-irradiated patterns 32a, 32b, and 32c have different heights from the firstly-irradiated patterns 31a, 31b, and 31c positioned adjacent thereto. For example, the maximum height of the secondly-irradiated patterns 32a, 32b, and 32c is smaller than the maximum height of the firstly-irradiated patterns 31a, 31b, and 31c. The minimum height of the secondly-irradiated patterns 32a, 32b, and 32c is smaller than the minimum height of the firstly-irradiated patterns 31a, 31b, and 31c.

The height differences h2a and h2b among the secondly-irradiated patterns 32a, 32b, and 32c may be determined based on the thicknesses of the interlayered insulating layers 200 and the horizontal layers 100. The height differences h2a and h2b among the secondly-irradiated patterns 32a, 32b, and 32c may be substantially the same as each other. The height differences h2a and h2b may be substantially equal to the height differences among the firstly-irradiated patterns 31a, 31b, and 31c. In that case, the height differences between two adjacent irradiated patterns may be substantially the same as each other. For example, the height difference between the firstly-irradiated pattern 31a and the secondly-irradiated pattern 32a is substantially the same as the height difference between the secondly-irradiated pattern 32a and the firstly-irradiated pattern 31b.

Figure 1D:
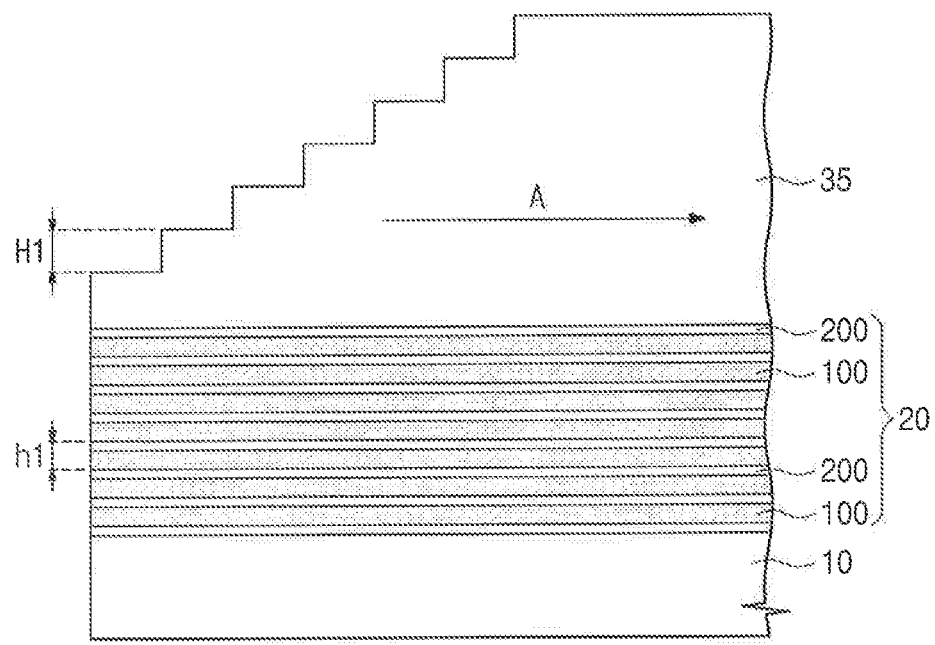

Referring to FIG. 1D, a developing process is performed to remove the firstly- and secondly-irradiated patterns 31a, 31b, 31c, 32a, 32b, and 32c and form a photoresist pattern 35 on the etch-target layer 20.

In a developing process, the firstly- and secondly-irradiated patterns 31a, 31b, 31c, 32a, 32b, and 32c are removed such that the photoresist pattern 35 has a staircase structure. For example, the photoresist pattern 35 may have a regularly increasing thickness or height H1 from an edge of the photoresist pattern 35 to a central region thereof. The regularly increasing thickness H1 of the photoresist pattern 35 may be greater than a sum h1 of thicknesses of the horizontal layer 100 and the interlayered insulating layer 200 in the etch-target layer 20.

Figure 1E:
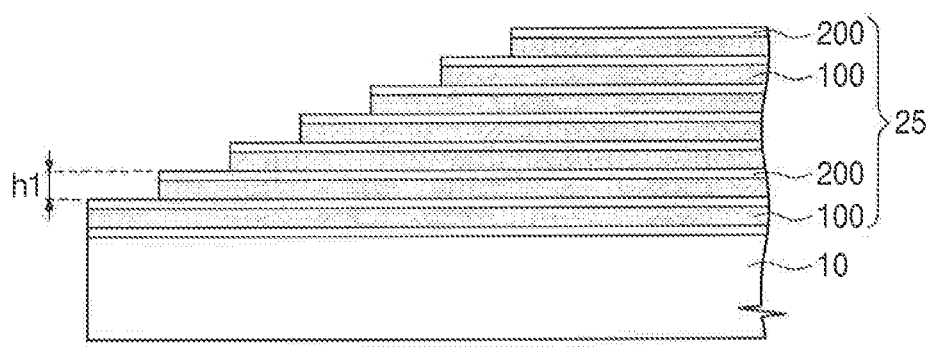

Referring to FIG. 1E, the etch-target layer 20 is anisotropically etched using the photoresist pattern 35 to form a lower structure 25 with a staircase structure.

To form the lower structure 25 on the etch-target layer 20, an anisotropic etching process may be performed until a top surface of the lowermost layer 200 of the etch-target layer 20 is exposed. For example, the anisotropic etching removes the photoresist pattern 35 in a vertical direction, and due to the staircase structure, the lower structure 25 recedes in a direction A exposing the etch-target layer 20. Here, the leftmost portion of the etch-target layer 20 is disposed under the photoresist pattern 35 having the smallest thickness, and thus the leftmost portion is first exposed and the leftmost portion is anisotropically etched until the top surface of the lowermost layer 200. Accordingly, after the anisotropic etching process, top surfaces of the interlayered insulating layers 200 and the horizontal layers 100 are exposed at different levels.

As described above, the use of the photoresist pattern 35 with the staircase structure makes it possible to form the lower structure 25 having the staircase structure in a single anisotropic etching process. For example, the lower structure 25 has the staircase structure whose vertical thickness increases by a height h1 from an edge of the substrate 10 to a central region thereof. In the staircase structure, sidewalls of the stacked horizontal layers 100 are located at different horizontal and vertical positions from each other. The distance between the adjacent sidewalls of the horizontal layers 100 may be dependent on the widths of the transmission regions 3a, 3b, and 3c of first and second photo masks M1 and M2.

Figure 2A:
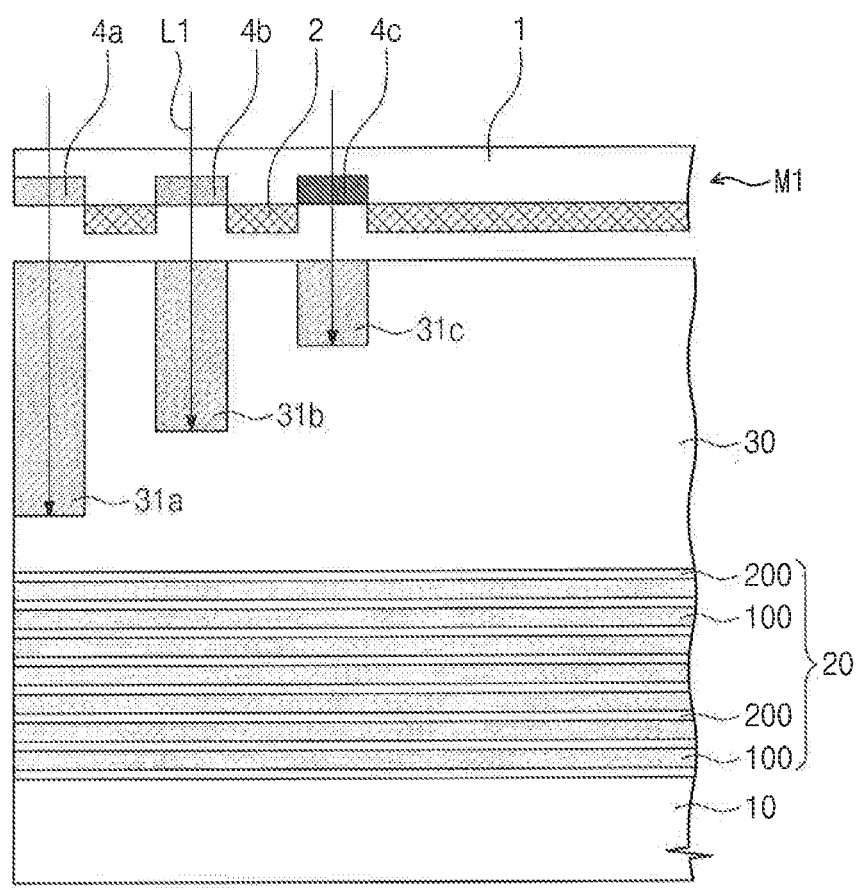
FIGS. 2A and 2B are cross-sectional views illustrating a method of fabricating a semiconductor device according to an exemplary embodiment of the inventive concept.
Figure 2B:
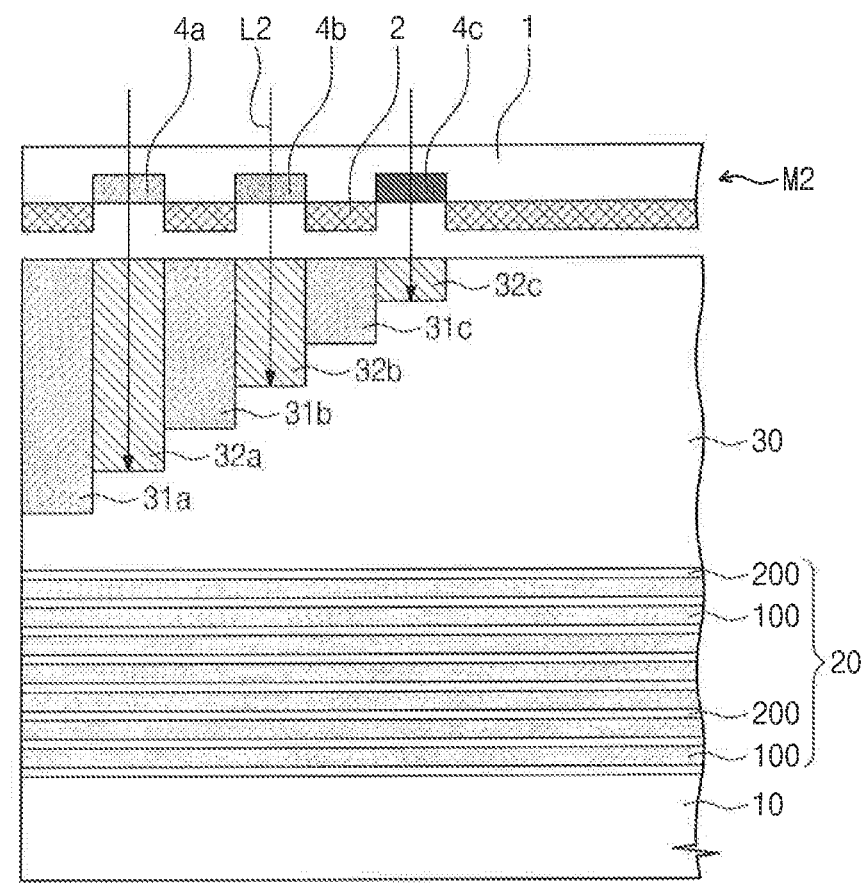

FIGS. 2A and 2B are cross-sectional views illustrating a method of fabricating a semiconductor device according to an exemplary embodiment of the inventive concept.

Referring to FIGS. 2A and 2B, mask substrates 1 of first and second photo masks M1 and M2 include a plurality of transmission regions 4a, 4b and 4c defined by the light-blocking patterns 2. The transmission regions 4a, 4b and 4c are doped with impurities. The impurities may include, for example, at least one of Ge, Ga, P and B.

The impurities of the transmission regions 4a, 4b and 4c may determine the transmittance thereof. The impurities may scatter light passing through the transmission regions 4a, 4b and 4c, and thus the transmittance of the transmission regions 4a, 4b and 4c may be adjusted depending on the impurity concentration thereof. For example, the light passing through the impurity regions 4a, 4b, and 4c of the first and second photo masks M1 and M2 may be reflected or scattered by impurities doped in the impurity regions 4a, 4b and 4c, and thus the transmittance of the impurity regions 4a, 4b and 4c of the first and second photo masks M1 and M2 is reduced. The higher an impurity concentration of the impurity regions 4a, 4b and 4c, the lower the intensity of the light having passed through the impurity regions 4a, 4b and 4c. Accordingly, the transmittance of the transmission regions 4a, 4b and 4c may be adjusted by the impurity concentrations of the impurity regions 4a, 4b and 4c.

Referring to FIG. 2A, a first exposure process is performed using the first photo mask M1 to form firstly-irradiated patterns 31a, 31b, and 31c in a photoresist layer 30. Here, the first photo mask M1 includes the first to third transmission regions 4a, 4b, and 4c that are doped with impurities. The first to third transmission regions 4a, 4b and 4c may have substantially the same thickness as each other. The first to third transmission regions 4a, 4b and 4c have different impurity concentrations from each other. For example, the first transmission region 4a has an impurity concentration lower than the second and third transmission regions 4b and 4c, and the third transmission region 4c has an impurity concentration higher than the first and second transmission regions 4a and 4b. Accordingly, the first to third transmission regions 4a, 4b, and 4c of the first photo mask M1 may have different optical transmittance from each other. For example, light having passing through the first to third transmission regions 4a, 4b, and 4c may be incident on corresponding portions of the photoresist layer 30 with different intensities. As a result, the firstly-irradiated patterns 31a, 31b, and 31c having different heights are formed in the photoresist layer 30, as described with reference to FIGS. 1A through 1E.

Referring to FIG. 2B, a second exposure process are performed using the second photo mask M2 to form secondly-irradiated patterns 32a, 32b, and 32c in the photoresist layer 30. Here, the second photo mask M2 includes the first to third transmission regions 4a, 4b, and 4c that are doped with impurities and have different impurity concentrations from each other. Accordingly, the first to third transmission regions 4a, 4b, and 4c have different optical transmittance from each other. The first to third transmission regions 4a, 4b and 4c of the second photo mask M2 have transmittance different from those of the first photo mask M1. As the result of the second exposure process, the secondly-irradiated patterns 32a, 32b, and 32c having different heights may be formed in the photoresist layer 30, as described with reference to FIGS. 1A through 1E.

Thereafter, as described with reference to FIGS. 1D and 1E, the firstly- and secondly-irradiated patterns 31 and 32 may be removed to form the photoresist pattern 35 with the staircase structure, and the etch-target layer 20 may be anisotropically etched to form the lower structure 25 having the staircase structure through only one anisotropic etching process.

Figure 3A:
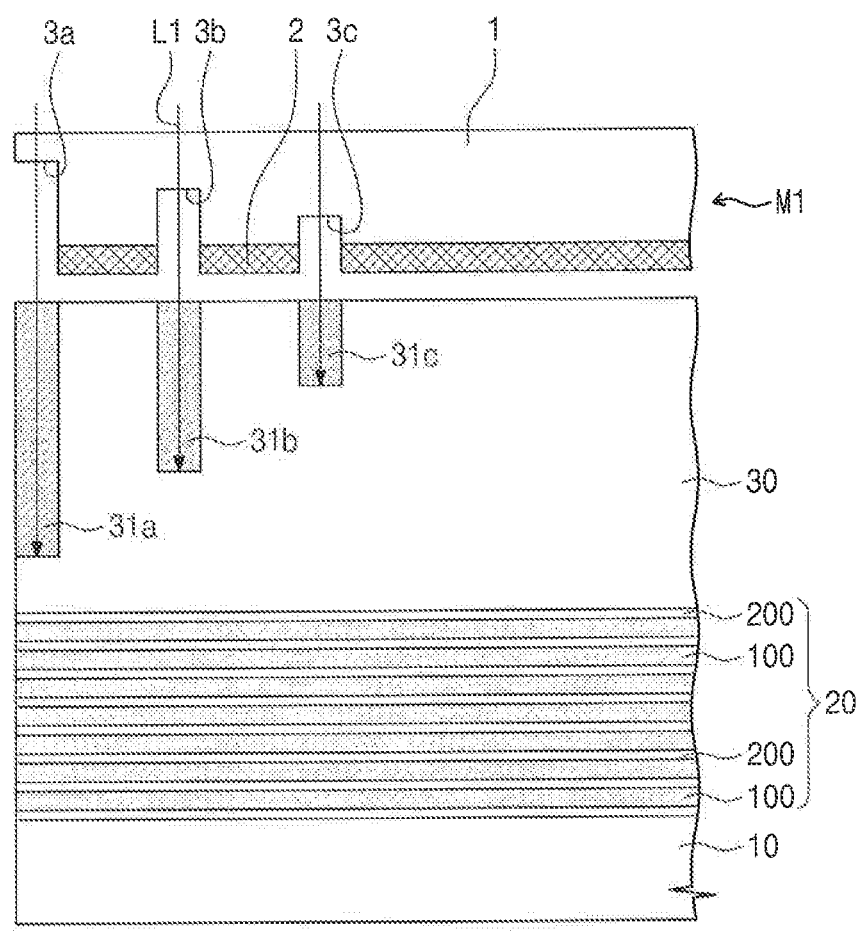
FIGS. 3A through 3D are cross-sectional views illustrating a method of fabricating a semiconductor device according to an exemplary embodiment of the inventive concept.
Figure 3B:
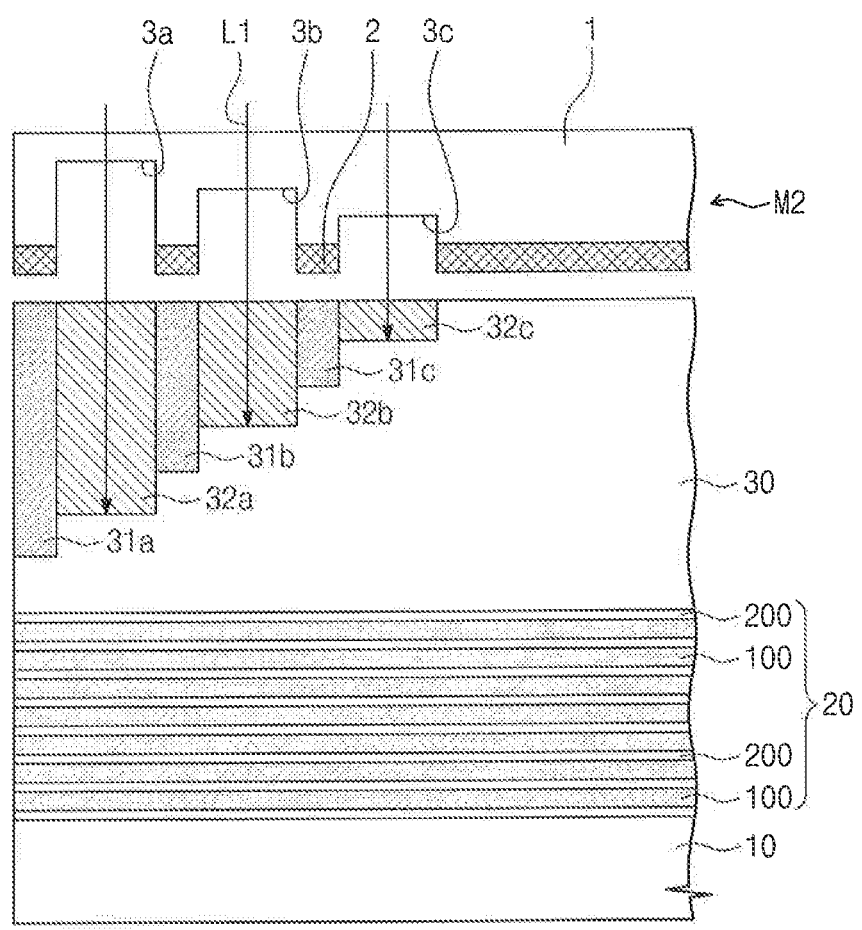

FIGS. 3A through 3D are cross-sectional views illustrating a method of fabricating a semiconductor device according to an exemplary embodiment of the inventive concept. As previously described, a patterning process of an etch-target layer 20 are performed using first and second exposure processes. The exposure processes are substantially similar to those as described above, except for using photo masks M1 and M2 different from those previously described with reference to FIGS. 1A to 1E and FIGS. 2A to 2B. Referring to FIGS. 3A and 3B, the transmission regions 3a, 3b, and 3c of the second photo mask M2 in the first exposure process have widths different from those of the transmission regions 3a, 3b, and 3c of the first photo mask M1 in the first exposure process.

Referring to FIG. 3A, the first exposure process is performed using the first photo mask M1 to form firstly-irradiated patterns 31a, 31b, and 31c in a photoresist layer 30. The first photo mask M1 includes transmission regions 3a, 3b, and 3c having different thicknesses from each other. The transmission regions 3a, 3b, and 3c have different transmittance from each other due to such thickness differences. The firstly-irradiated patterns 31a, 31b, and 31c have heights different from each other. The firstly-irradiated patterns 31a, 31b and 31c have substantially the same widths as each other.

Referring to FIG. 3B, the second exposure process is performed using the second photo mask M2 to form secondly-irradiated patterns 31a, 31b, and 31c in the photoresist layer 30. The second photo mask M2 includes transmission regions 3a. 3b, and 3c having different thicknesses from each other. The transmission regions 3a, 3b, and 3c of the second photo mask M2 have widths greater than the transmission regions 3a, 3b and 3c of the first photo mask M1.

Using the first and second exposure processes, the firstly-irradiated patterns 31a, 31b and 31c and the secondly-irradiated patterns 32a, 32b, and 32c are alternately formed. For example, the secondly-irradiated pattern 32a is formed between two firstly-irradiated patterns 31 and 32a. Similarly, other secondly-irradiated patterns 32b and 32c are formed. The secondly-irradiated patterns 32a, 32b, and 32c have different heights from each other, and the widths of the secondly-irradiated patterns 32a, 32b, and 32c are greater than those of the firstly-irradiated patterns 31a, 31b, and 31c.

Figure 3C:
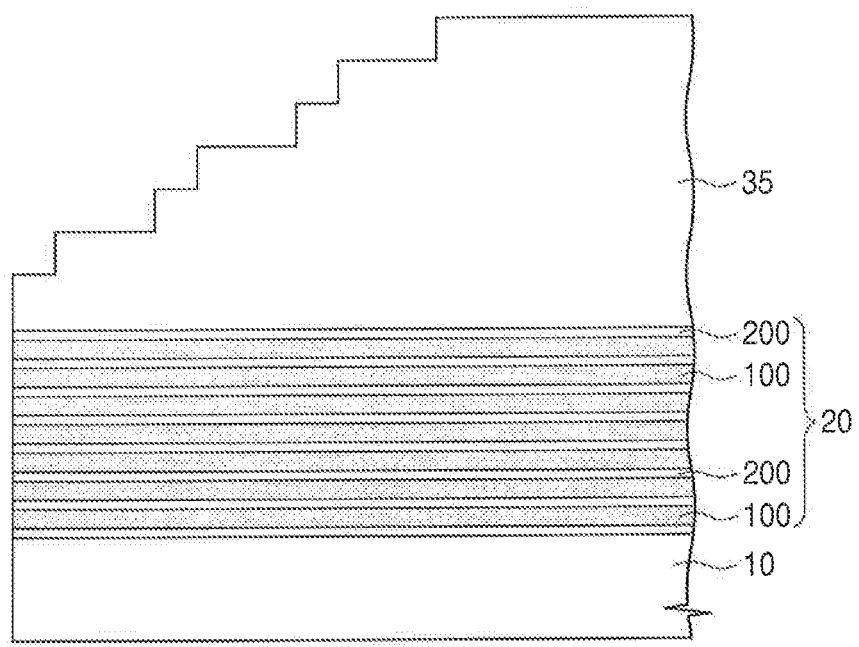
Figure 3D:
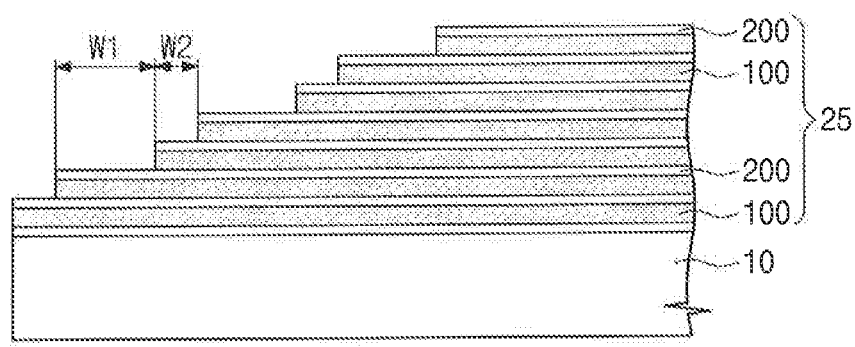

Referring to FIG. 3C, the firstly- and secondly-irradiated patterns 31a-31c, 32a-32c are removed to form a photoresist pattern 35 having the staircase structure, as described with reference to FIG. 11). Referring to FIG. 3D, the etch-target layer 20 may be anisotropically etched using the photoresist pattern 35, as described with reference to FIG. 1E, and thus, the lower structure 25 having the staircase structure may be formed through a single anisotropic etching process. Due to the difference in widths between the firstly- and secondly-irradiated patterns 31a-31c and 32a-32c, horizontal distances between the sidewalls of the vertically-adjacent horizontal layers in the lower structure 25 have two different values W1 and W2.

Figure 4A:
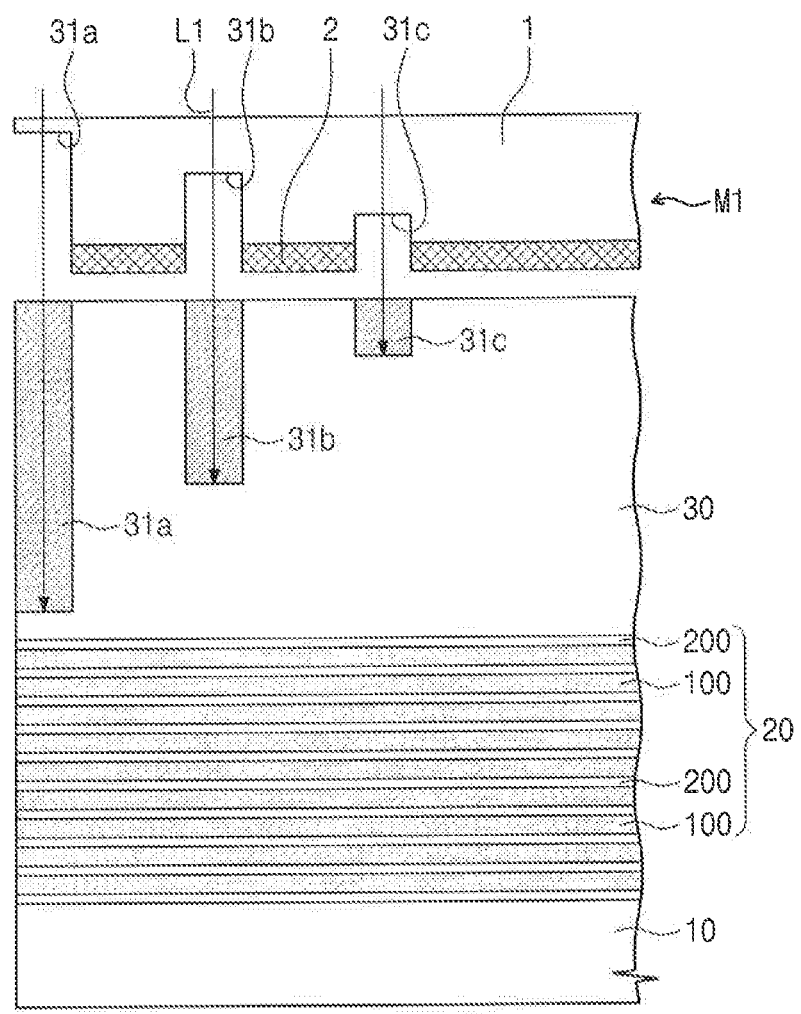
FIGS. 4A through 4C are cross-sectional views illustrating a method of fabricating a semiconductor device according to an exemplary embodiment of the inventive concept.
Figure 4B:
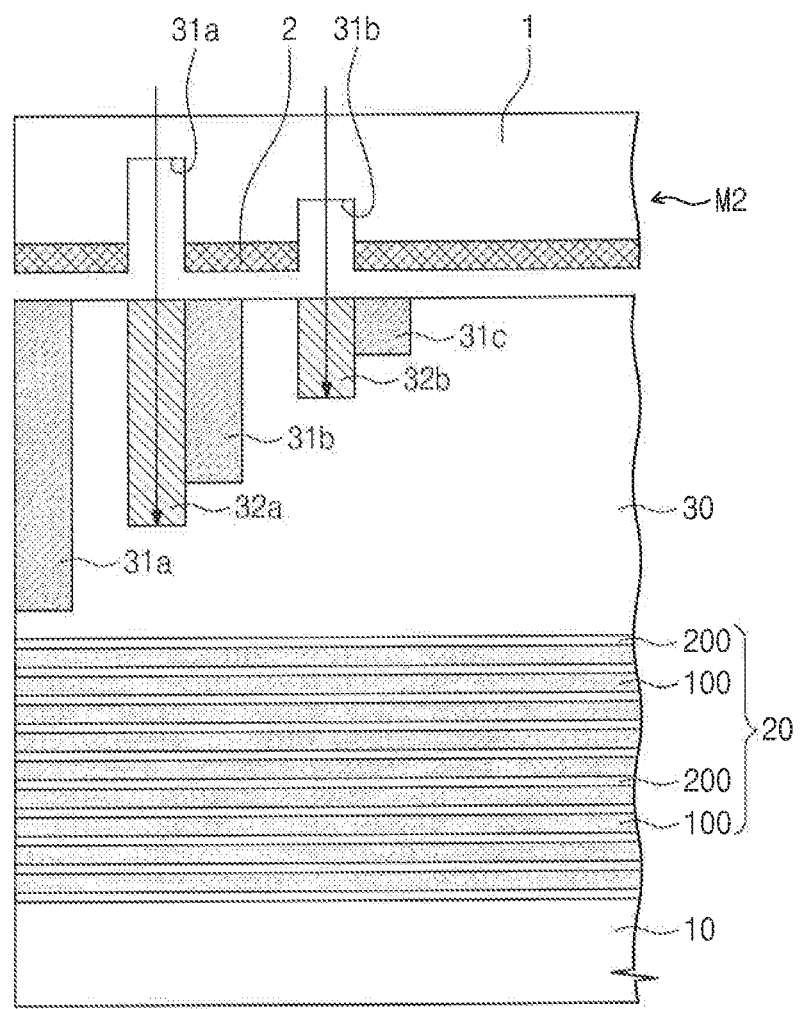
Figure 4C:
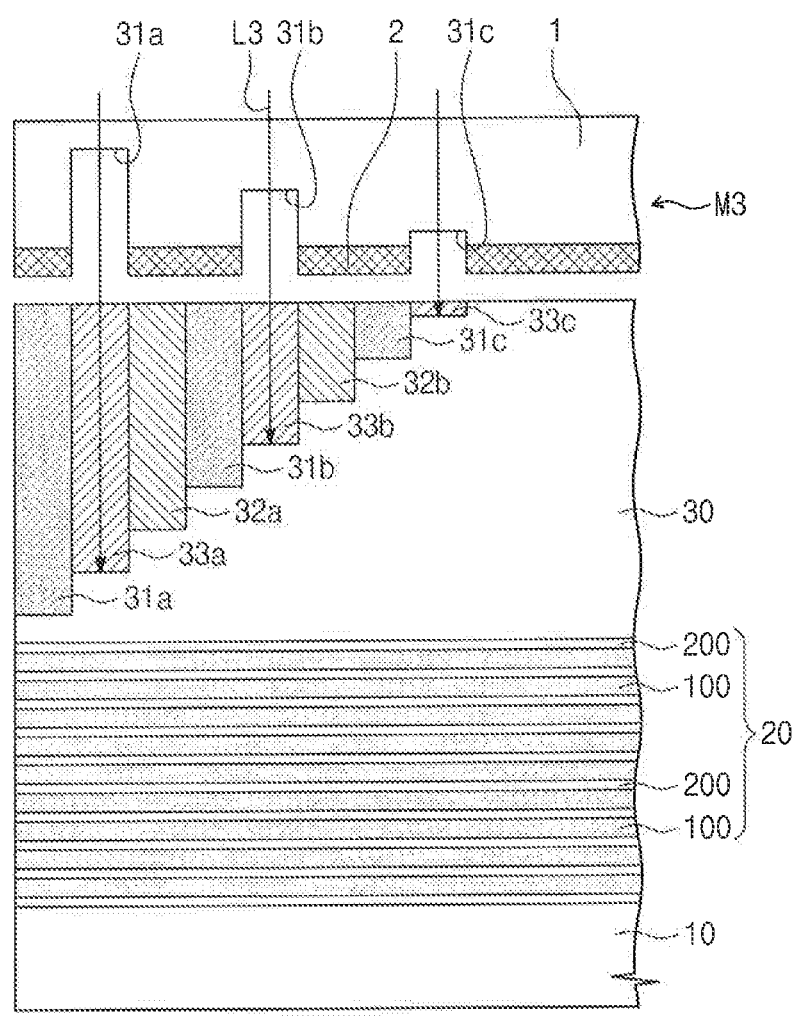

FIGS. 4A through 4C are cross-sectional views illustrating a method of fabricating a semiconductor device according to an exemplary embodiment of the inventive concept.

Referring to FIGS. 4A through 4C, a three exposure process including first, second, and third exposure processes is performed to form a photoresist pattern with a staircase structure.

Referring to FIG. 4A, the first exposure process is performed using a first photo mask M1 to form firstly-irradiated patterns 31a, 31b, and 31c in a photoresist layer 30. The first photo mask M1 includes transmission regions 3a, 3b, and 3c having thicknesses different from each other. The transmission regions 3a, 3b and 3c have optical transmittance that is different from each other. The firstly-irradiated patterns 31a, 31b, and 31c are formed using the first photo mask M1, having substantially the same width and different heights from each other, as described above.

Spaces between the transmission regions 3a, 3b, and 3c of the first photo mask M1 may be greater than those exemplary embodiments as described with reference to FIGS. 1A through 1E. Such wider spaces may reduce interference between lights having passed through the transmission regions 3a, 3b, and 3c in the first, second, and third exposure processes.

Referring to FIG. 4B, the second exposure process is performed using the second photo mask M2 to form secondly-irradiated patterns 32a, 32b, and 32c in the photoresist layer 30. The first photo mask M1 may be used as the second photo mask M2. In that case, the first photo mask M1 may be shifted such that the secondly-irradiated patterns 32a, 32b and 32c are formed to be contact with the firstly-irradiated patterns 31a, 31b and 31c, respectively. In this case, the second exposure process may be performed using a light whose intensity is lower than that of the first exposure process. Alternatively, the second exposure process may be performed using a second photo mask having optical transmittance that is different from a first photo mask. In that case, the light of the first exposure process may be substantially the same as the light of the second exposure process.

Each of the secondly-irradiated patterns 32a, 32b, and 32c formed by the second exposure process is positioned between a corresponding pair of the firstly-irradiated patterns 31a, 31b, and 31c. Each of the secondly-irradiated patterns 32a, 32b and 32c has a height that is different from that of the corresponding one of the firstly-irradiated pattern 31a, 31b, 31c adjacent thereto.

Referring to FIG. 4C, the third exposure process is performed using a third photo mask M3 to form thirdly-irradiated patterns 33a, 33b, and 33c in the photoresist layer 30. The first photo mask M1 may be used as the third photo mask M3. In that case, the first photo mask M1 may be shifted such that the thirdly-irradiated patterns 32a, 32b and 32c are formed to interpose between the firstly-irradiated patterns 31a, 31b and 31c and the secondly-irradiated patterns. The third exposure process may be performed using light whose intensity is lower than that for the second exposure process. Alternatively, the third exposure process may be performed using a third photo mask having optical transmittance that is different from a second photo mask of the second exposure process.

Each of the thirdly-irradiated patterns 33a, 33b, and 33c formed by the third exposure process may be positioned between a corresponding pair the firstly- and secondly-irradiated patterns 31a, 31b, 31c, 32a, 32b, and 32c and have a height that is different from that of the corresponding one of the firstly and secondly-irradiated patterns 31a, 31b, 31c, 32a, 32b, and 32c adjacent thereto.

Thereafter, as described with reference to FIG. 1D, the first to secondly-irradiated patterns 31a-31c and 32a-32c may be removed to form a photoresist pattern with a staircase structure. Next, as described with reference to FIG. 1E, the etch-target layer 20 may be anisotropically etched using the photoresist pattern, and thus, a lower structure having a staircase structure may be formed through a single anisotropic etching process.

Figure 5A:
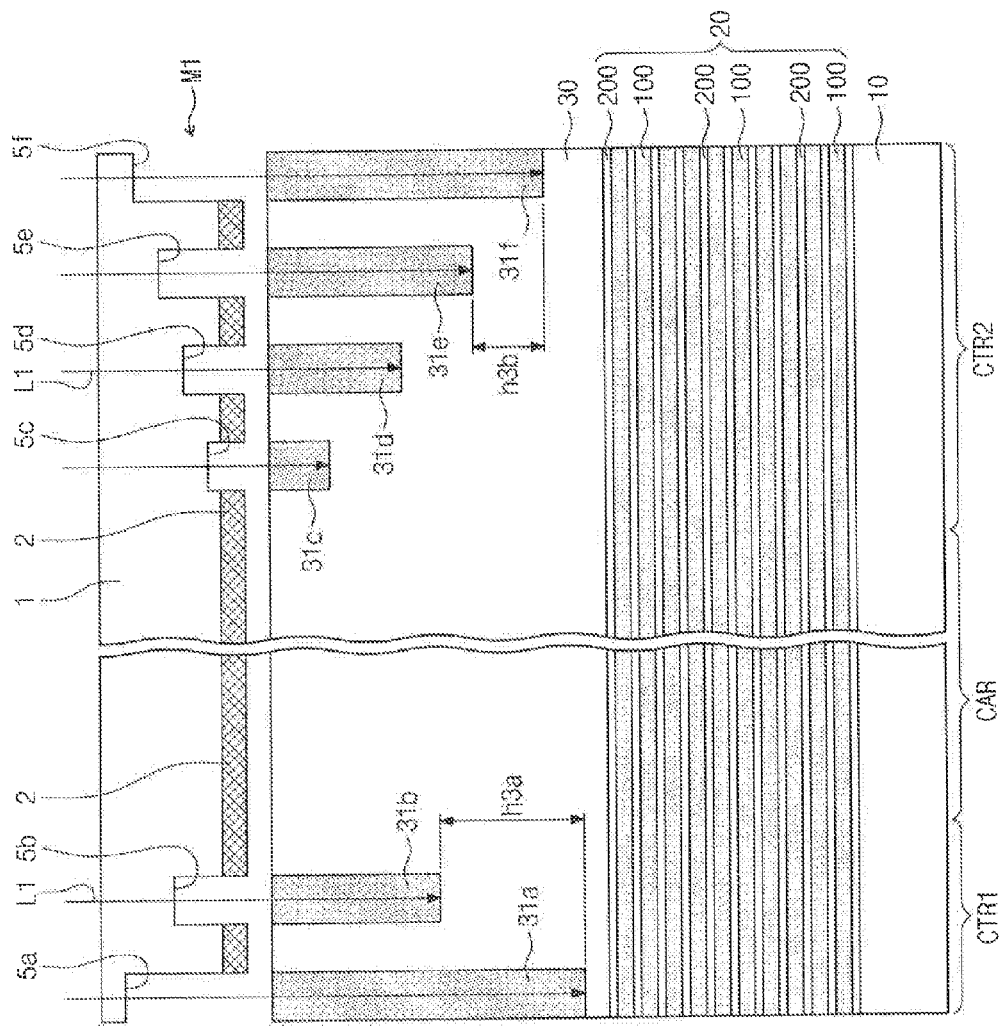

FIGS. 5A through 5D are cross-sectional views illustrating a method of fabricating a semiconductor device according to an exemplary embodiment of the inventive concept. Referring to FIG. 5A, an etch-target layer 20 is formed on a semiconductor substrate 10. The semiconductor substrate 10 includes a first contact region CTR1, a second contact region CTR2, and a cell array region CAR provided therebetween.

The etch-target layer 20 is formed to cover the first and second contact regions CTR1 and CTR2 and the cell array region CAR of the semiconductor substrate 10. The etch-target layer 20 may be formed by alternately and repeatedly depositing two different layers having etch selectivity with respect to each other. For example, the etch-target layer 20 includes horizontal layers 100 and interlayered insulating layers 200.

Thereafter, the photoresist layer 30 is formed on the etch-target layer 20. The photoresist layer 30 may be formed using a spin-on coating method and be thicker than the etch-target layer 20. The photoresist layer 30 may be a positive-type photoresist and include a photo-acid generator (PAG). After the formation of the photoresist layer 30 on the etch-target layer 20, a soft bake process may be performed to the structure of FIG. 5A.

As shown in FIG. 5A, a first exposure process IS performed using a first photo mask M1 to form firstly-irradiated patterns 31a, 31b, 31c, 31d, 31e, and 31f in the photoresist layer 30, The first photo mask M1 included first transmission regions 5a and 5b corresponding to the first contact region CTR1 of the semiconductor substrate 10 and second transmission regions 5c, 5d, 5e, and 5f corresponding to the second contact region CTR2 of the semiconductor substrate 10. For example, the first photo mask M1 includes a mask substrate 1, light-blocking patterns 2 on the mask substrate 1, and the first and second transmission regions 5a, 5b, 5c, 5d, 5e, and 5f defined by the light-blocking patterns 2.

The first photo mask M1 includes the first transmission regions 5a and 5b having different optical transmittance from each other. The first photo mask M1 further includes the second transmission regions 5c, 5d, 5e, and 5f having different optical transmittance from each other. For example, the thicknesses of the transmission regions 5a to 5f are different from each other.

Since the first exposure process is performed using the first photo mask M1, the firstly-irradiated patterns 31a, 31b, 31c, 31d, 31e, and 31f are formed in the first contact region CTR1 and the second contact region CTR2. Since the optical transmittance in the first exposure process is different between the first and second contact regions CTR1 and CTR2, the firstly-irradiated patterns 31a to 31f may have heights different from each other. The first contact region CTR1 has a height difference greater than a height difference in the second contact region CTR2. For example, the height difference h3a of the first contact region CTR1 is greater than the height difference h3b of the second contact region CTR2.

Referring to FIG. 5B, a second exposure process is performed using a second photo mask M2 to form secondly-irradiated patterns 32a, 32b, 32c, 32d, 32e, and 32f in the photoresist layer 30.

The second photo mask M2 includes first transmission regions 5a and 5b corresponding to the first contact region CTR1 of the semiconductor substrate 10 and second transmission regions 5c, 5d, 5e, and 5f corresponding to the second contact region CTR2. The first photo mask M1 may be used as the second photo mask M2 in the second exposure process. In that case, the first photo mask M1 may be shifted such that the secondly-irradiated patterns 32a, 32b, 32c, 32d, 32e, and 32f are formed between a corresponding pair of the firstly-irradiated patterns 31a, 31b, 31c, 31d, 31e, and 31f. The height difference h4a between two adjacent firstly-irradiated pattern and secondly-irradiated pattern in the first contact region CTR1 is greater than the height difference h4b between two adjacent firstly-irradiated pattern and secondly-irradiated pattern in the second contact region CTR2. Further, the height difference h4b of the second contact region CTR2 may be greater than a sum of thicknesses of the horizontal layer 100 and the interlayered insulating layer 200 in the etch-target layer 20.

Referring to FIG. 5C, a developing process is performed to form a photoresist pattern 35 by removing the patterns 31a-

31*f* and 32*a*-32*f*. The photoresist pattern 35 includes asymmetric staircase structures in the first and second contact regions CTR1 and CTR2.

Figure 5D:
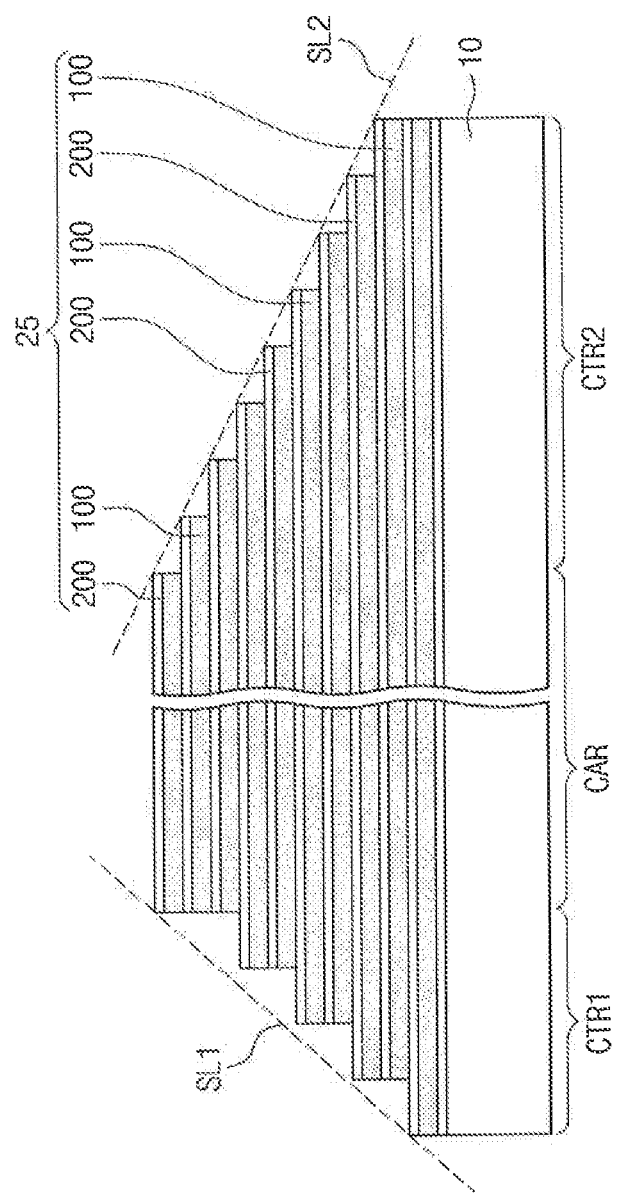

Referring to FIG. 5D, the etch-target layer 20 includes a lower structure 25 formed by performing an anisotropic etching process using the photoresist pattern 35.

Since the photoresist pattern 35 has two different staircase structures formed in the first and second contact regions CTR1 and CTR2, respectively, an etch amount of the etch-target layer 20 may differ between the first and the second contact regions CTR1 and CTR2. Further, in each of the first and second contact regions CTR1 and CTR2, the etch amount of the etch-target layer 20 may decrease with decreasing distance from the cell array region CAR.

As shown in FIG. 5D, the staircase structures on the first and second contact regions CTR1 and CTR2 of the lower structure 25 are asymmetric to each other. For example, in each of the first and second contact regions CTR1 and CTR2, the interlayered insulating layers 100 or the horizontal layers 200 of the lower structure 25 may be sequentially removed to form the staircase structures. An imaginary sidewall slope SL1 of the lower structure 25 in the first contact region CTR1 is steeper than an imaginary sidewall slope SL2 in the second contact region CTR2.

FIGS. 6A through 6H are cross-sectional views illustrating a method of fabricating a semiconductor device according to an exemplary embodiment of the inventive concept.

Figure 6A:
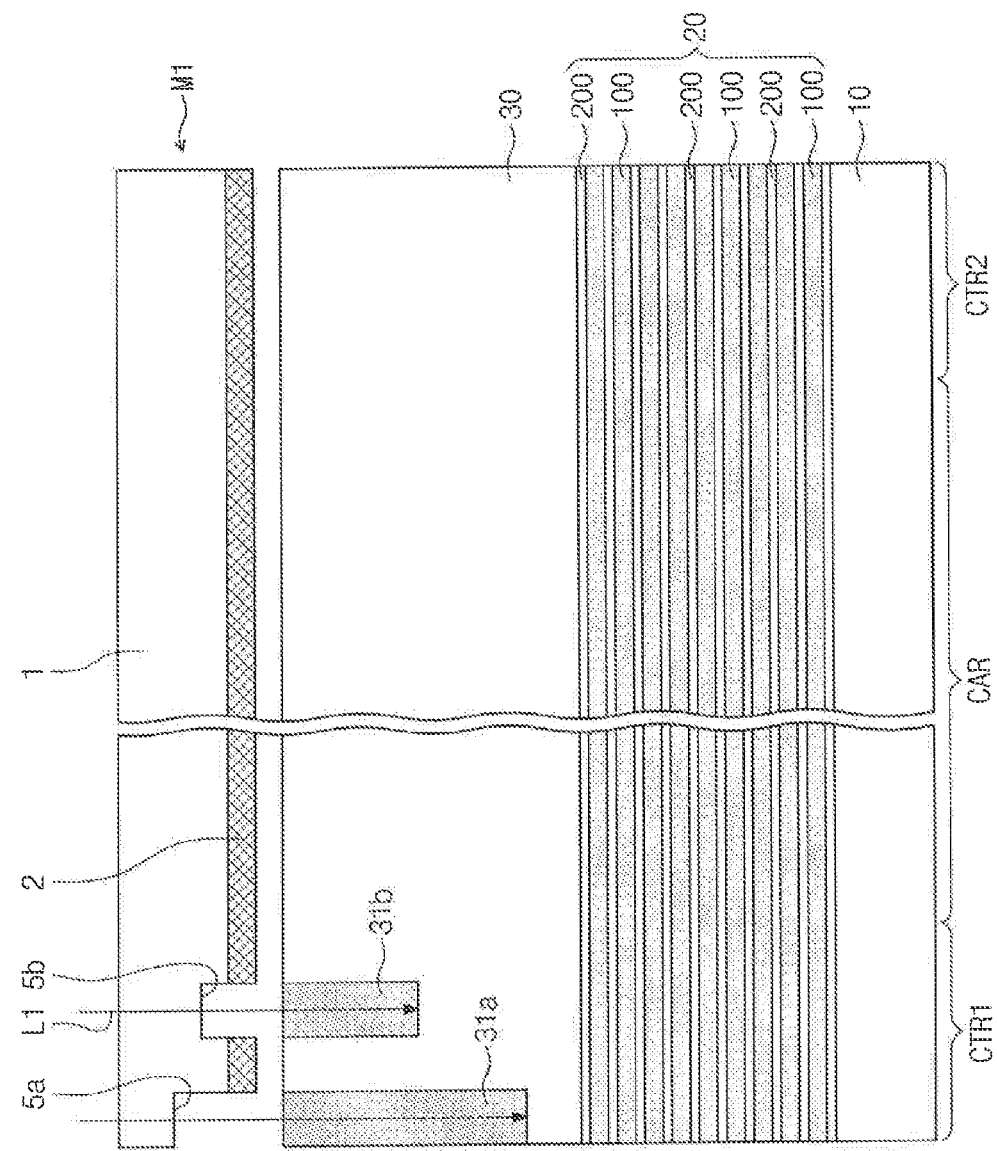

Referring to FIG. 6A, an etch-target layer 20 and a first photoresist layer 30 are sequentially formed on a semiconductor substrate 10 having a first contact region CTR1, a second contact region CTR2, and a cell array region CAR therebetween.

A first photo mask M1 includes first transmission regions 5*a* and 5*b* corresponding to the first contact region CTR1. For example, the first photo mask M1 includes a mask substrate 1, light-blocking patterns 2 on the mask substrate 1, and first transmission regions 5*a* and 5*b* defined by the light-blocking patterns 2.

The first transmission regions 5*a* and 5*b* have different optical transmittance from each other. For example, the thickness of the first transmission region 5*a* is different from the thickness of the second transmission region 5*b*. Accordingly, the firstly-irradiated patterns 31*a* and 31*b* having a height difference therebetween may be formed in the photoresist layer 30 on the first contact region CTR1.

Figure 6B:
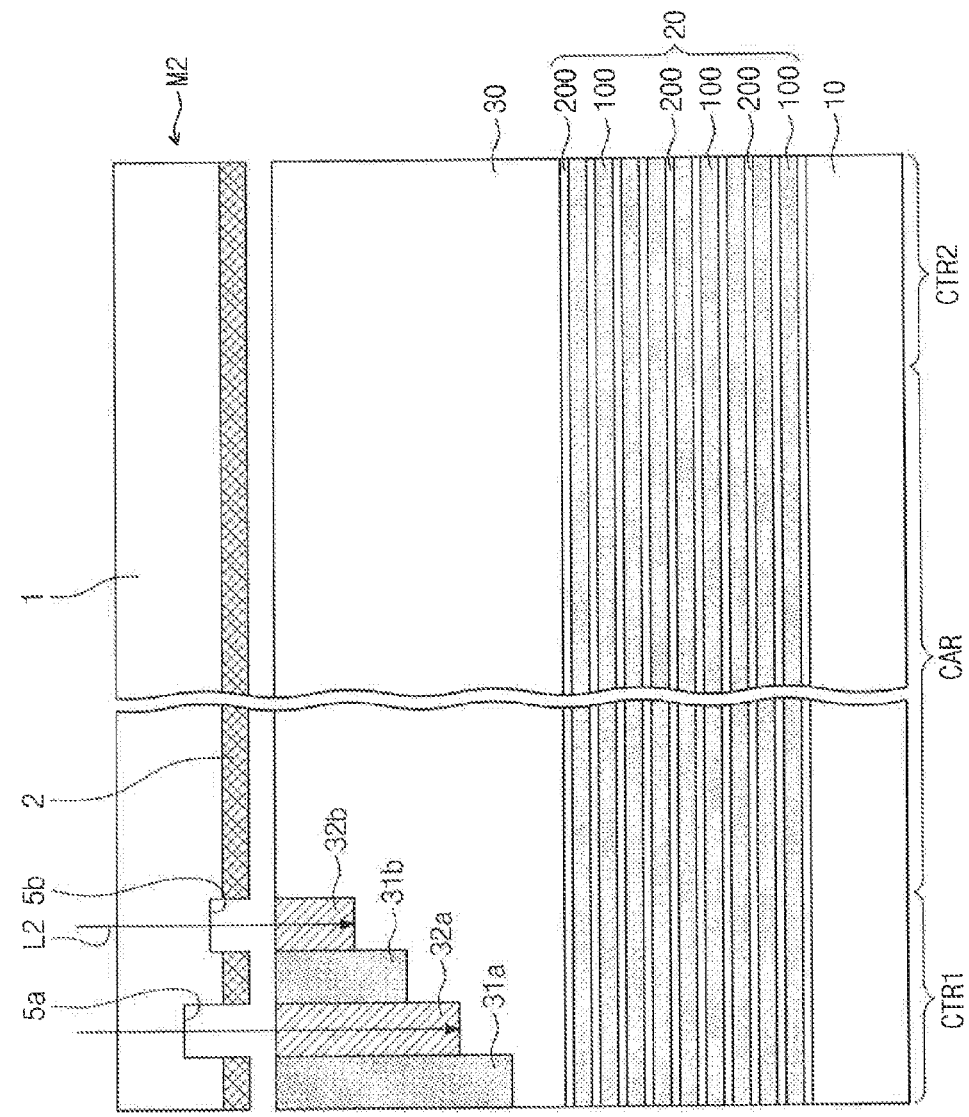

Referring to FIG. 6B, a second exposure process is performed using a second photo mask M2 to form secondly-irradiated patterns 32*a* and 32*b* in the first photoresist layer 30. The second photo mask M2 includes second transmission regions 5*a* and 5*b* corresponding to the first contact region CTR1. The first photo mask M1 may be used as the second photo mask M2. In that case, the first photo mask M1 may be shifted such that each of the secondly-irradiated patterns 32*a* and 32*b* is formed between a corresponding pair of the firstly-irradiated patterns 31*a* and 31*b* and has a height different from each of the firstly-irradiated patterns 31*a* and 31*b* adjacent thereto.

Referring to FIG. 6C, a developing process is performed to form a first photoresist pattern 35 by removing the firstly- and secondly-irradiated patterns 31*a*, 31*b*, 32*a*, and 32*b*. The first photoresist pattern 35 has a staircase structure on the first contact region CTR1, as shown in FIG. 6C.

Referring to FIG. 6D, a first anisotropic etching process is performed to the etch-target layer 20 using the first photoresist pattern 35, thereby forming a preliminary lower structure 23. The first anisotropic etching process exposes top surfaces of the interlayered insulating layers 200 or the horizontal layers 100 constituting a lower portion of the etch-target layer 20. For example, a staircase structure is formed in the preliminary lower structure 23.

Referring to FIG. 6E, after the formation of the preliminary lower structure 23, a second photoresist layer 40 is formed on the semiconductor substrate 10 to cover the preliminary lower structure 23.

A third exposure process is performed using a third photo mask M3 to form thirdly-irradiated patterns 41*a* and 41*b*. The third photo mask M3 includes third transmission regions 6*a* and 6*b* corresponding to the second contact region CTR2 of the semiconductor substrate 10. In the third exposure process, the third transmission regions 6*a* and 6*b* have different transmittance from each other. For example, the second transmission regions 6*a* and 6*b* of the mask substrate 1 have different thicknesses from each other. Accordingly, the thirdly-irradiated patterns 41*a* and 41*b* having a height difference are formed in the photoresist layer 30 on the second contact region CTR2.

Referring to FIG. 6F, a fourth exposure process is performed using a fourth photo mask M4 to form fourth irradiated patterns 42*a* and 42*b*. The fourth photo mask M4 includes fourth transmission regions 6*a* and 6*b* corresponding to the second contact region CTR2. The third photo mask M3 may be used as the fourth photo mask M4. In that case, the third photo mask M3 is shifted such that each of the fourth irradiated patterns 42*a* and 42*b* is formed between adjacent ones of the thirdly-irradiated patterns 41*a* and 41*b* and has height different from those of the thirdly-irradiated patterns 41*a* and 41*b*.

Figure 6G:
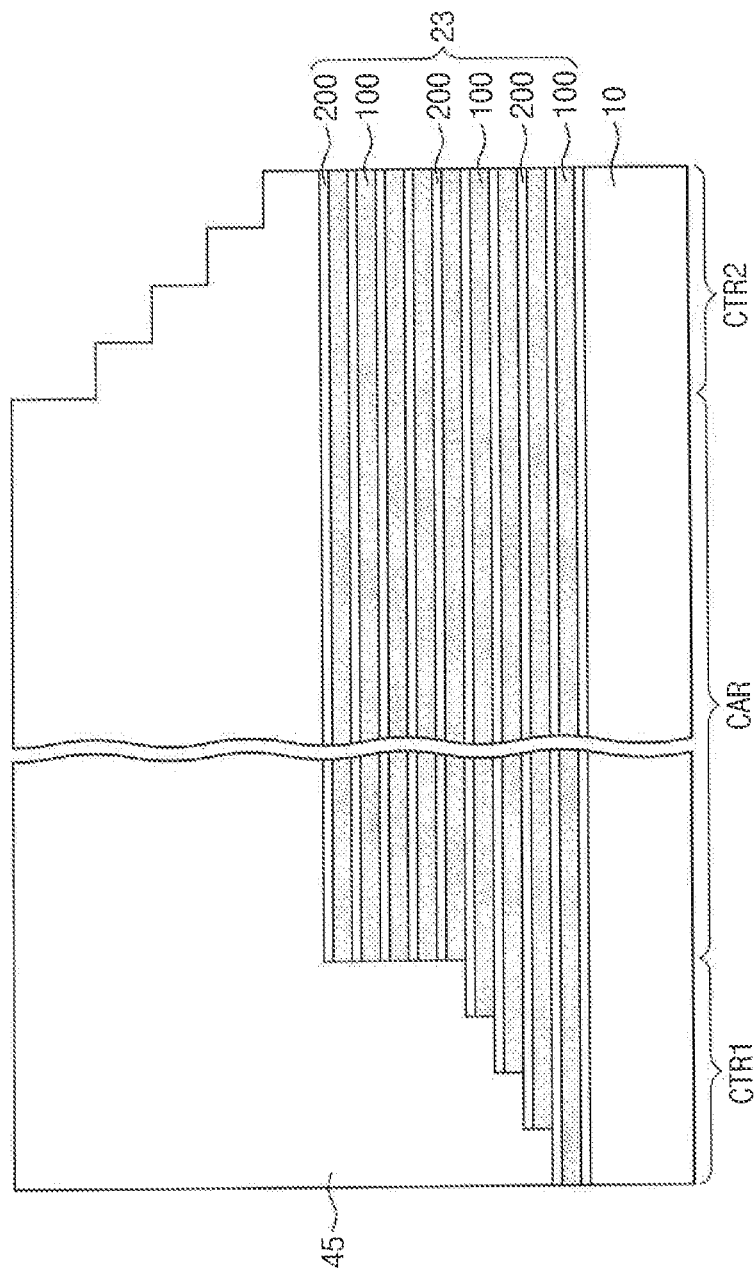

Referring to FIG. 6G, the third and fourth irradiated patterns 41*a*, 41*b*, 42*a*, and 42*b* are removed by a developing process, thereby forming a second photoresist pattern 45. As shown, the second photoresist pattern 45 has a staircase structure on the second contact region CTR2.

Referring to FIG. 6H, a second anisotropic etching process is performed to form a lower structure 25 using the second photoresist pattern 45. The second anisotropic etching process exposes top surfaces of the interlayered insulating layers 200 or the horizontal layers 100 constituting an upper portion of the preliminary lower structure 23. For example, a staircase structure is formed in the upper portion of the preliminary lower structure 23.

The staircase structures of the lower structure 25 formed on the first and second contact regions CTR1 and CTR2 are asymmetric to each other. For example, in the first contact region CTR1, the interlayered insulating layers 200 and the horizontal layers 100 constituting the lower portion of the lower structure 25 are sequentially exposed to form the staircase structure, while in the second contact region CTR2, the interlayered insulating layers 200 and the horizontal layers 100 constituting the upper portion of the lower structure 25 are sequentially exposed to form the staircase structure.

FIGS. 7A through 7E are cross-sectional views illustrating a method of fabricating a semiconductor device according to an exemplary embodiment of the inventive concept.

Figure 7A:
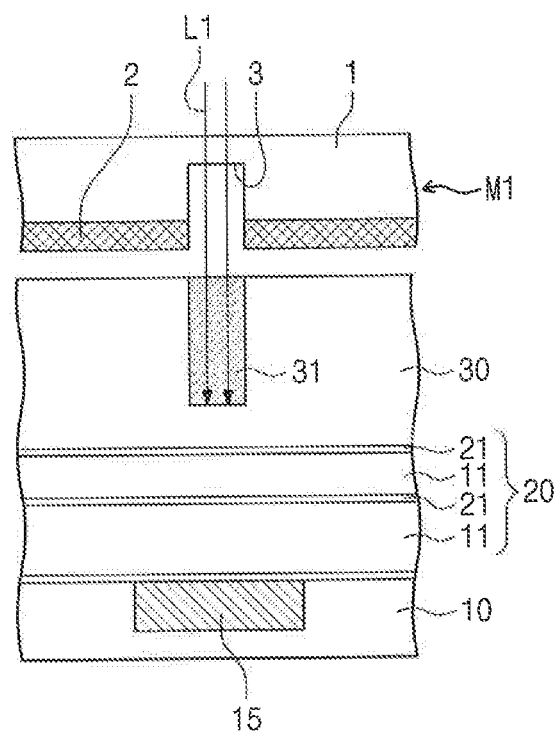
FIGS. 7A through 7E are cross-sectional views illustrating a method of fabricating a semiconductor device according to an exemplary embodiment of the inventive concept.

Referring to FIG. 7A, the etch-target layer 20 is formed on an underlying layer 10 having lower interconnections 15.

The underlying layer 10 may include a semiconductor substrate (not shown), semiconductor devices (e.g., MOS transistors, capacitors, and resistors) (not shown) integrated on the semiconductor substrate, and at least one insulating layer covering the semiconductor devices. Here, the semiconductor devices may be electrically connected to the lower interconnections 15. The insulating layers may include at least one low-k dielectric material whose dielectric constant is lower than that of silicon oxide. The insulating layers may serve as an inter-metal dielectric (IMD).

The lower interconnections 15 may be formed of a metal material with low resistivity. The lower interconnections 15 may be formed by performing a patterning or damascene process to a metal layer. The lower interconnections 15 may include a barrier metal layer and a metal layer. The barrier metal layer may include at least one of, for example, Ti, Ta, Mo, TixNy, TaxNy, TixZry, TixZryNz, NbxNy, ZrxNy, WxNy, VxNy, HfxNy, MoxNy, RexNy, and TixSiyNz. The metal layer 23 may include at least one of, for example, tungsten, copper, and aluminum.

The etch-target layer 20 may include a plurality of interlayered insulating layers 11 and at least one etch stop layer 21 interposed therebetween. The interlayered insulating layer 11 may include a low-k dielectric material whose dielectric constant is lower than that of silicon oxide. For example, the interlayered insulating layer 11 may serve as an inter-metal dielectric (IMD) layer. For example, the interlayered insulating layer 11 may include high density plasma (HDP) oxide, tetraethylorthosilicate (TEOS), plasma-enhanced TEOS (PE-TEOS), $O_3$-TEOS, undoped silicate glass (USG), phosphosilicate glass (PSG), borosilicate glass (BSG), borophosphosilicate glass (BPSG), fluoride silicate glass (FSG), spin on glass (SOG), tonen silazene (TOSZ), or any combination thereof. In addition, the interlayered insulating layer 11 may be formed of or include at least one of silicon nitride, silicon oxynitride, or low-k dielectrics. The etch stop layer 21 may include SiN, SiON, SiC, SiCN, BN (Boron Nitride), or any combination thereof.

Thereafter, the photoresist layer 30 is formed on the etch-target layer 20. As described above, the photoresist layer 30 may be formed using a spin-on coating process, having a thickness greater than that of the etch-target layer 20. Further, the photoresist layer 30 may be a positive-type photoresist and include a photo-acid generator (PAG). After the formation of the photoresist layer 30 on the etch-target layer 20, a soft bake process may be performed to the resulting structure.

Referring to FIG. 7A, a first exposure process is performed to the photoresist layer 30 using a first photo mask M1.

The first photo mask M1 includes a mask substrate 1, light-blocking patterns 2 on the mask substrate 1, and a transmission region 3 defined by the light-blocking patterns 2.

The transmittance of the transmission region 3 may depend on its thickness. The transmission region 3 of the first photo mask M1 is aligned to overlap the lower interconnection 15. The transmission region 3 of the first photo mask M1 may be circular or square in plan view.

As described above, by performing the first exposure process using the first photo mask M1, a firstly-irradiated pattern 31 is formed in the photoresist layer 30. For example, incident light L1 is incident on the photoresist layer 30 through the transmission region 3 of the first photo mask M1, and then, the irradiated portions of the photoresist layer 30 absorb the optical energy of the incident light. Due to the absorbed energy, the irradiated portions are converted into the firstly-irradiated pattern 31 which is selectively removed by developing solution. The height of the firstly-irradiated pattern 31 may depend on the amount of the absorbed optical energy. The firstly-irradiated pattern 31 may have a width that is smaller than that of the lower interconnection 15.

Figure 7B:
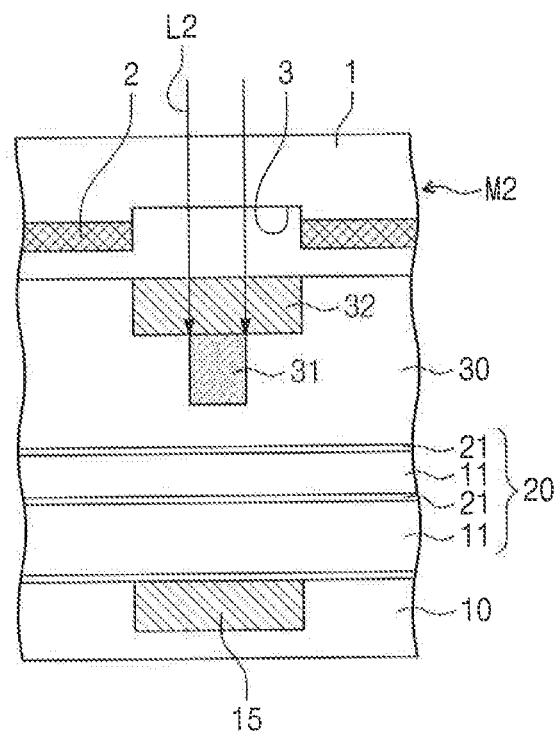

Referring to FIG. 7B, a second exposure process is performed using a second photo mask M2.

The second photo mask M2 includes a mask substrate 1, light-blocking patterns 2 on the mask substrate 1, and a transmission region 3 defined by the light-blocking patterns 2. A thickness of the transmission region 3 of the second photo mask M2 may be greater than that of the first photo mask M1. A width of the transmission region 3 of the second photo mask M2 may be greater than that of the first photo mask M1. The transmission region 3 of the second photo mask M2 may be linear in plan view.

The transmission region 3 of the second photo mask M2 is aligned to overlap the firstly-irradiated pattern 31. The transmittance of the transmission region 3 in the second photo mask M2 is lower than the transmittance of the transmission region 3 in the first photo mask M1. If the first and second exposure processes use substantially the same light as each other, the height of the secondly-irradiated pattern 32 is smaller than that of the firstly-irradiated pattern 31. Alternatively, the first and second exposure processes may use light different from each other. The secondly-irradiated pattern 32 has a line shape that overlaps the firstly-irradiated pattern 31. The width of the secondly-irradiated pattern 32 is greater than that of the firstly-irradiated pattern 31. The resulting irradiated pattern after the first and second exposure process is T-shaped.

Figure 7C:
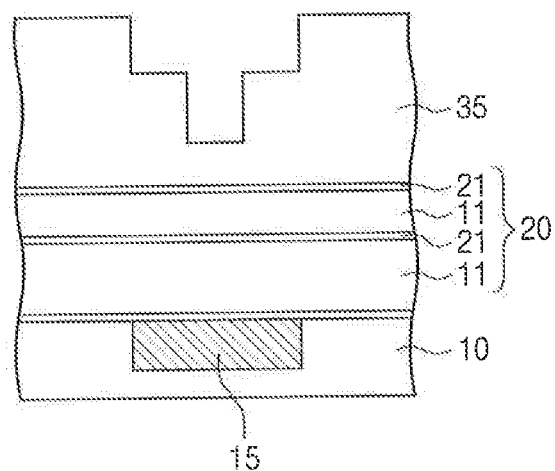

Referring to FIG. 7C, a developing process is performed to remove the firstly- and secondly-irradiated patterns 31 and 32 to form a photoresist pattern 35. The photo resist pattern 35 has a staircase portion over the lower interconnection 15.

Figure 7D:
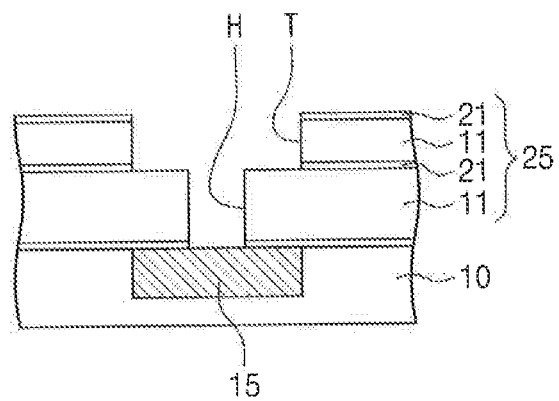

Referring to FIG. 7D, the etch-target layer 20 is anisotropically etched using the photoresist pattern 35 to form a lower structure 25 in the etch-target layer 20.

Since the photoresist pattern 35 with the staircase portion is used as an etch mask in the anisotropic etching process, the etch-target layer 20 has a staircase portion which is substantially similar to that of the photoresist pattern 35. For example, the lower structure 25 includes a contact hole H exposing the lower interconnection 15 through the interlayered insulating layers and a trench T connected to the contact hole H. The trench T is linear, extending along a direction.

The contact hole H and the trench T are formed by performing a single anisotropic etching process using the photoresist pattern 35. Accordingly, a process of fabricating a semiconductor device may be simplified.

Figure 7E:
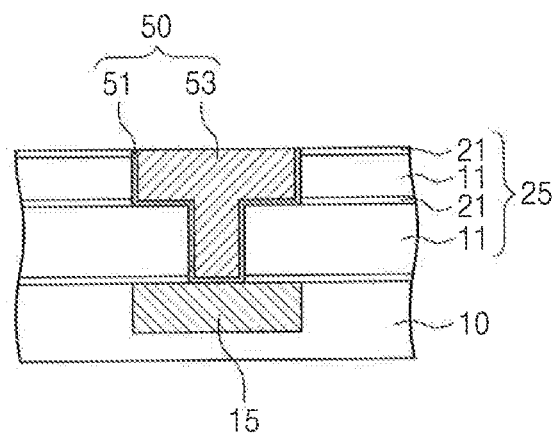

Referring to FIG. 7E, an interconnection structure 50 is formed by filling the contact hole H and the trench T with a conductive material. The formation of the interconnection structure may include sequentially depositing a barrier metal layer 51 and a metal layer 53 in the contact hole H and the trench T. The harrier metal layer 51 may be formed to conformally cover inner surfaces of the contact hole H and the trench T. The barrier metal layer 51 may include at least one of, for example, Ta, TaN, TaSiN, Ti, TiN, TiSiN, W, and WN. The metal layer 53 may include a metallic material, such as copper, aluminum, cobalt, titanium, nickel, tungsten, and/or molybdenum.

A three-dimensional semiconductor memory device may be formed using an exemplary patterning method according to the present inventive concept, as described above.

Figure 8:
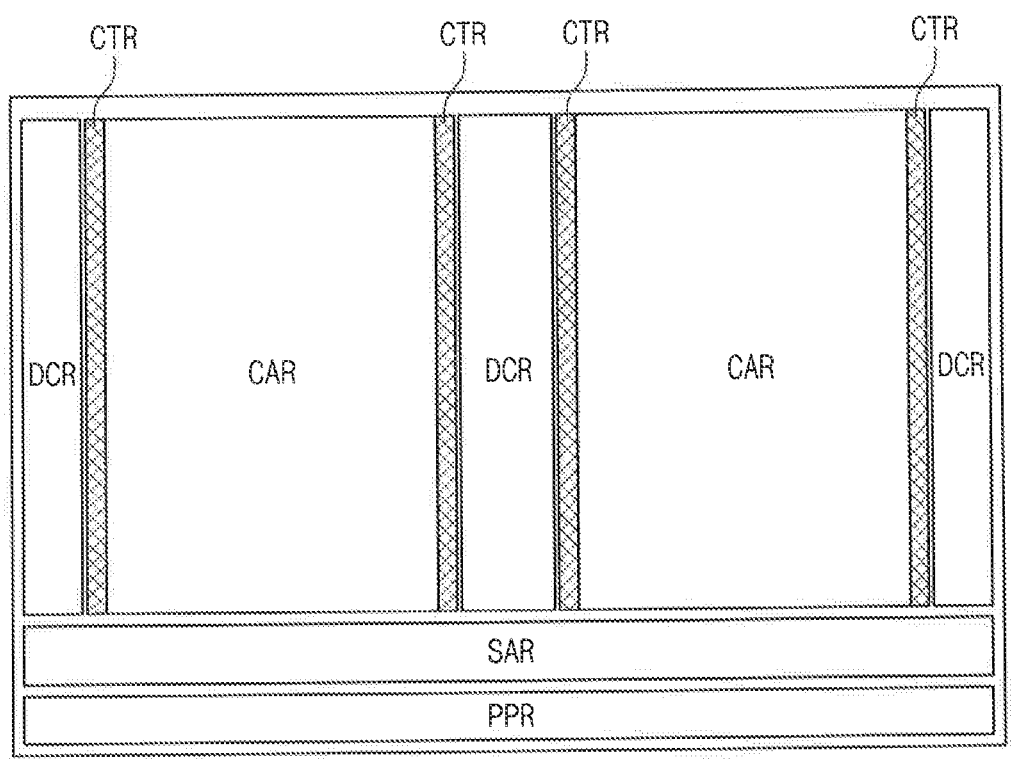
FIG. 8 is a layout diagram illustrating a three-dimensional semiconductor memory device according to an exemplary embodiment of the inventive concept.

FIG. 8 is a layout diagram illustrating a three-dimensional semiconductor memory device according to an exemplary embodiment of the inventive concept.

Referring to FIG. 8, a three-dimensional semiconductor device includes a cell array region CAR, a peripheral circuit region PPR, a sense amplifier region SAR, a decoding circuit region DCR, and a contact region CTR. A plurality of memory cells may be three-dimensionally arranged in the cell array region CAR. Further, bit lines and word lines may be disposed in the cell array region CAR to provide electric signals to the memory cells. The word lines (or horizontal electrodes) may he vertically stacked in the cell array region CAR. Several circuits for operating the memory cells may be provided in the peripheral circuit region PPR, and sensing circuits for data stored in the memory cells may be provided in the sense amplifier region SAR. The contact region CTR may be provided between the cell array region CAR and the decoding circuit region DCR. In the contact region CTR, an interconnection structure may be provided to connect the word lines electrically to the decoding circuit region DCR.

The word lines or the horizontal electrodes may extend from the cell array region CAR to the contact region CTR. The end portions of the word lines disposed in the contract region CTR may have a staircase structure. The staircase structure of the word lines may be formed using a patterning method according to an exemplary embodiment of the inventive concept. With the staircase structure of the word lines, the word lines three-dimensionally stacked may be connected to decoding circuits provided in the decoding circuit region DCR.

Figure 9:
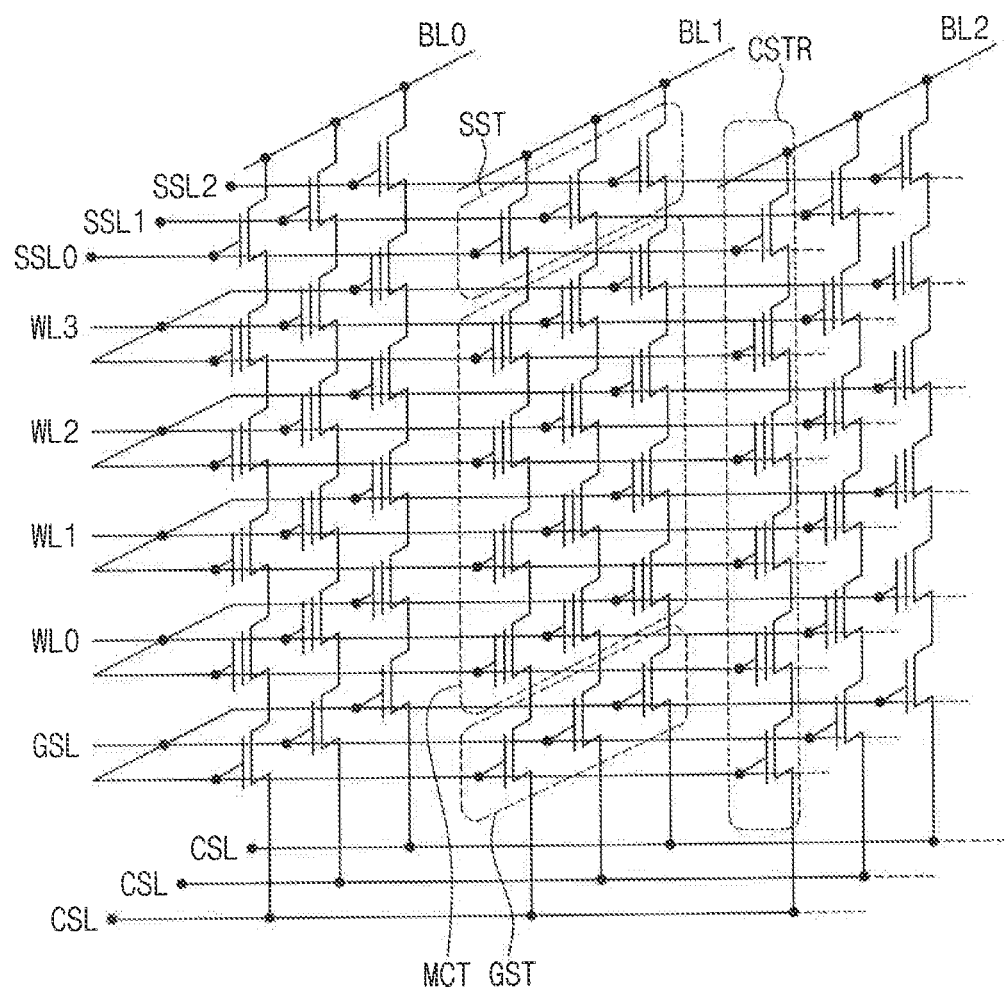
FIGS. 9 and 10 are circuit diagrams illustrating a three-dimensional semiconductor device according to an exemplary embodiment of the inventive concept.
Figure 10:
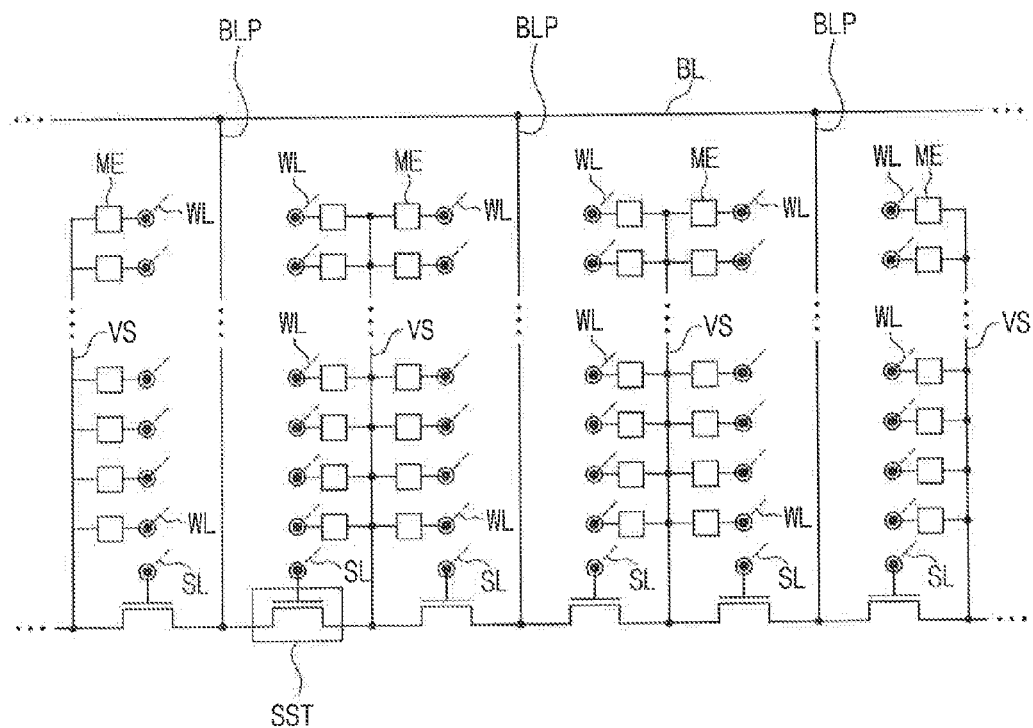

FIGS. 9 and 10 are circuit diagrams illustrating a three-dimensional semiconductor device according to an exemplary embodiment of the inventive concept.

Referring to FIG. 9, a three-dimensional semiconductor memory device includes a common source line CSL, a plurality of bit lines BL0, BL1, and BL2, and a plurality of cell strings CSTR disposed between the common source line CSL and the bit lines BL0-BL2.

The common source line CSL may be a conductive pattern provided on the substrate 10 or a doped region provided in the substrate 10. The bit lines BL0-BL2 may be conductive patterns (for example, metal lines) provided over the substrate 10. The bit lines BL0-BL2 are two-dimensionally arranged, and a plurality of cell strings CSTR is connected in parallel to each of the bit lines BL0-BL2. Accordingly, the cell strings CSTR are two-dimensionally provided on the common source line CSL or the substrate 10.

Each of the cell strings CSTR includes a ground selection transistor GST coupled to the common source line CSL, a string selection transistor SST coupled to one of the bit lines BL0-BL2, and a plurality of memory cell transistors MCT disposed between the ground and string selection transistors GST and SST. The ground selection transistor GST, the string selection transistor SST, and the memory cell transistors MCT are connected in series. Furthermore, a ground selection line GSL, a plurality of word lines WL0-WL3 and a plurality of string selection lines SSL0-SSL2 are provided between the common source line CSL and the bit lines BL0-BL2 to serve as gate electrodes of the ground selection transistor GST, the memory cell transistors MCT, and the string selection transistors SST, respectively.

The ground selection transistors GST are disposed at substantially the same level (for example, relative to the substrate 10), and the gate electrodes thereof are connected in common to the ground selection line GSL, thereby being in an equipotential state. Similarly, the gate electrodes of the memory cell transistors MCT located at the same level are connected in common to one of the word lines WL0-WL3, thereby being in an equipotential state. Since each of the cell strings CSTR includes a plurality of the memory cell transistors MCT disposed at different levels from each other, the word lines WL0-WL3 have a multi-layered structure between the common source line CSL and the bit lines BL0-BL2. According to an exemplary embodiment, the word lines WL0-WL3 are formed in a multi-layered structure.

Referring to FIG. 10, a plurality of selection transistors SST is connected in parallel to a bit line BL via a plurality of bit line plugs BLP. Each of the bit line plugs BLP is connected in common to a pair of the selection transistors SST disposed adjacent thereto.

A plurality of word lines WL and a plurality of vertical structures VS are provided between the bit line BL and the selection transistors SST. The word lines WL are configured in a multi-layered structure, as described above. The vertical structures VS are provided between the bit line plugs BLP. For example, the vertical structures VS and the bit line plugs BLP are alternately arranged along a direction parallel to the bit line BL. Furthermore, each of the vertical structures VS is connected in common to a pair of the selection transistors SST disposed adjacent thereto.

A plurality of memory elements ME is connected in parallel to each of the vertical structures VS. Each of the memory elements ME is connected to the corresponding one of the word lines WL. For example, each of the word lines WL is connected to the corresponding one of the vertical structures VS via the corresponding one of the memory elements ME.

Each of the selection transistors SST includes a selection line SL serving as a gate electrode thereof. The selection lines SL is parallel to the word lines WL.

The inventive concept is not limited to the three-dimensional semiconductor memory device of FIGS. 9 and 10, and may be applied to various structures of a three-dimensional semiconductor memory device.

Figure 11:
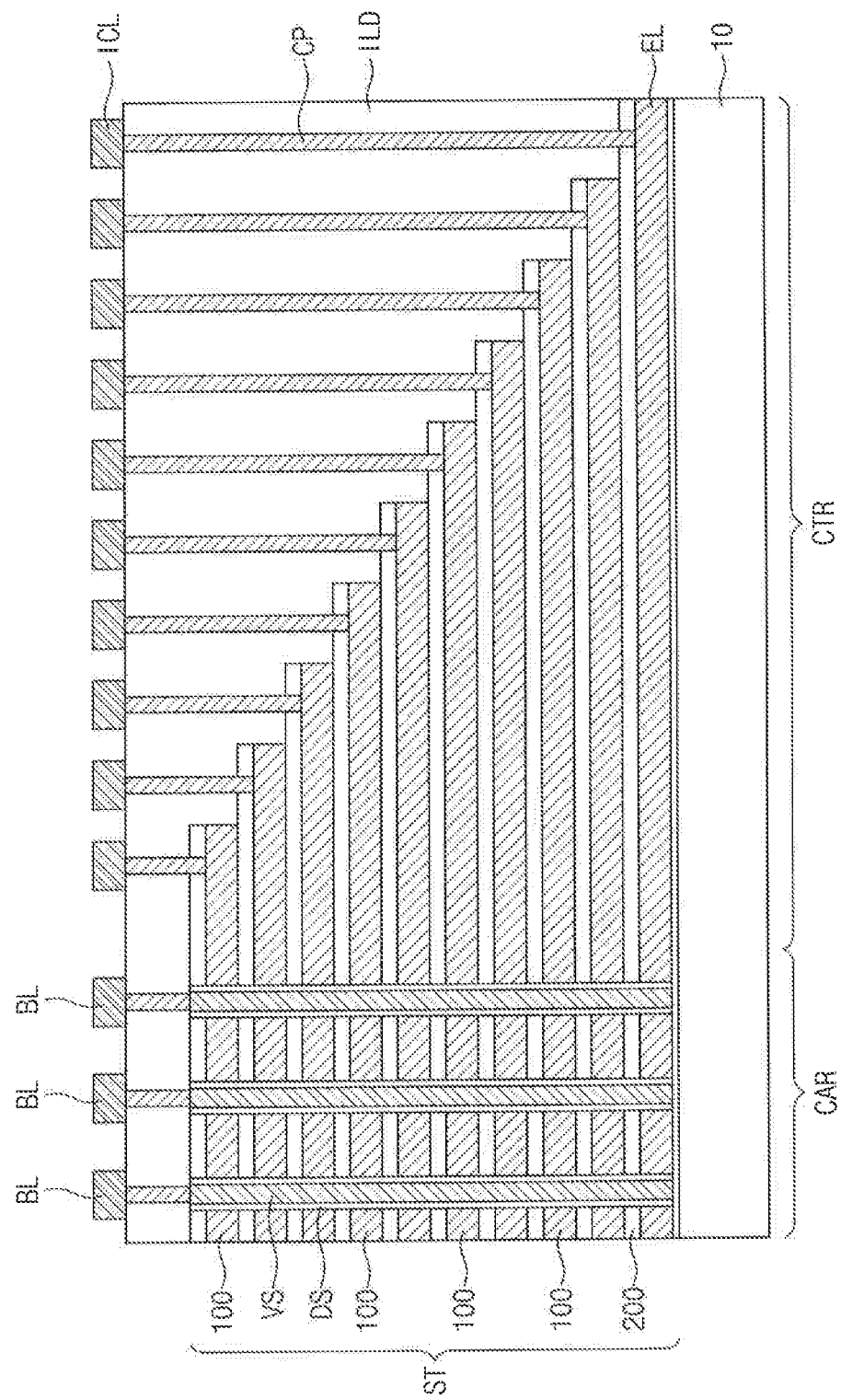
FIG. 11 is a cross-sectional view illustrating a three-dimensional semiconductor memory device according to an exemplary embodiment of the inventive concept.

FIG. 11 is a cross-sectional view illustrating a three-dimensional semiconductor memory device according to an exemplary embodiment of the inventive concept.

Referring to FIG. 11, the substrate 10 includes a cell array region CAR and a contact regions CTR provided at both sides of the cell array region CAR.

Horizontal electrodes EL and interlayered insulating layers 200 are alternately stacked on the substrate 10 to form a stack ST. The stack ST has a staircase structure in the contact region CTR. The staircase structure of the stack ST is formed using a patterning method according to an exemplary embodiment, as described with reference to the previous exemplary embodiments. The horizontal electrodes EL may be referred to as the horizontal layers 100 in the previous embodiments.

As shown in FIG. 11, in the contact region CTR, the horizontal electrodes EL of the stack ST have sidewalls located at different horizontal positions. For example, horizontal lengths of the horizontal electrodes EL in the contact region CTR increase with decreasing vertical height. In the contact region CTR, the vertical height of the stack ST increase stepwise with decreasing distance from the cell array region CAR. For example, in the contact region CTR, the end portions of the horizontal electrodes EL may have different horizontal and vertical positions from each other.

Each of the horizontal electrodes EL includes a plate shape covering wholly the cell array region CAR. Alternatively, each of the horizontal electrodes EL may have a line-shaped structure extending along a direction on the cell array region CAR. The cell array region CAR will be described with reference to FIGS. 12 through 14.

Referring back to FIG. 11, an upper interconnection structure is provided on the stack ST with the staircase structure. The upper interconnection structure includes contact plugs CP and conductive lines ICL. The contact plugs CP penetrate an upper insulating layer ILD to be connected to the horizontal electrodes EL. The conductive lines ICL are formed on the upper insulating layer ILD and are connected to the contact plugs CR The contact plugs CP have different vertical lengths from each other.

Figure 12:
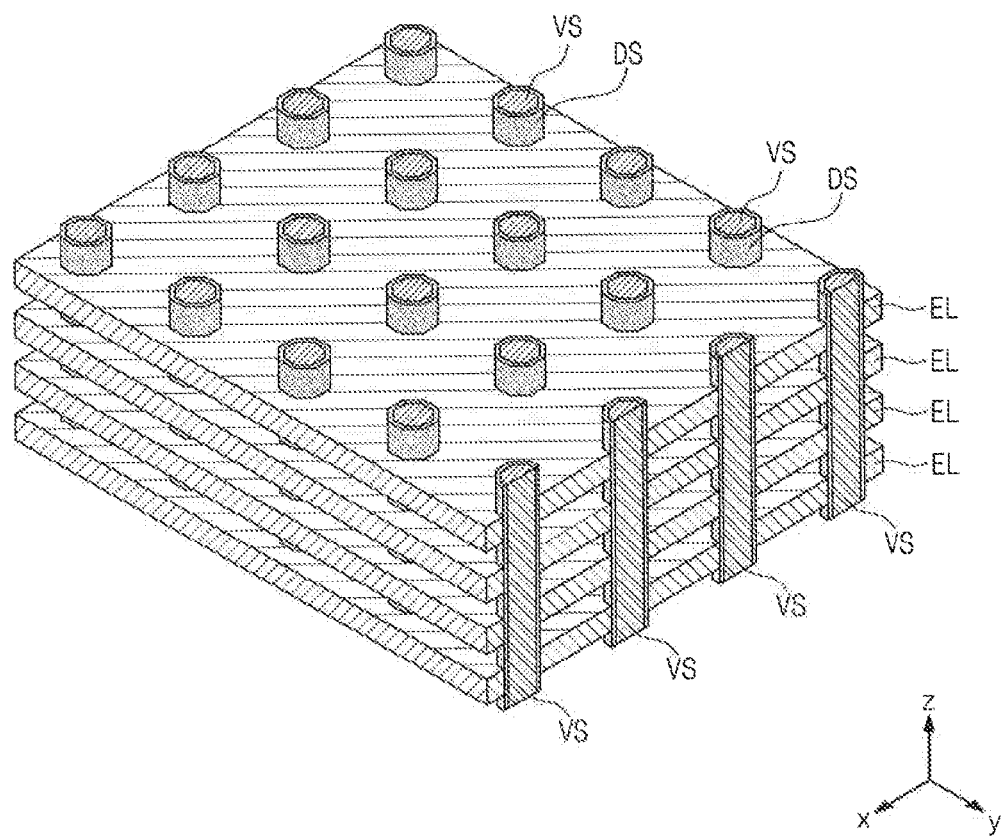
FIGS. 12 through 15 are perspective views illustrating a cell array structure of a three-dimensional semiconductor device according to an exemplary embodiment of the inventive concept.
Figure 13:
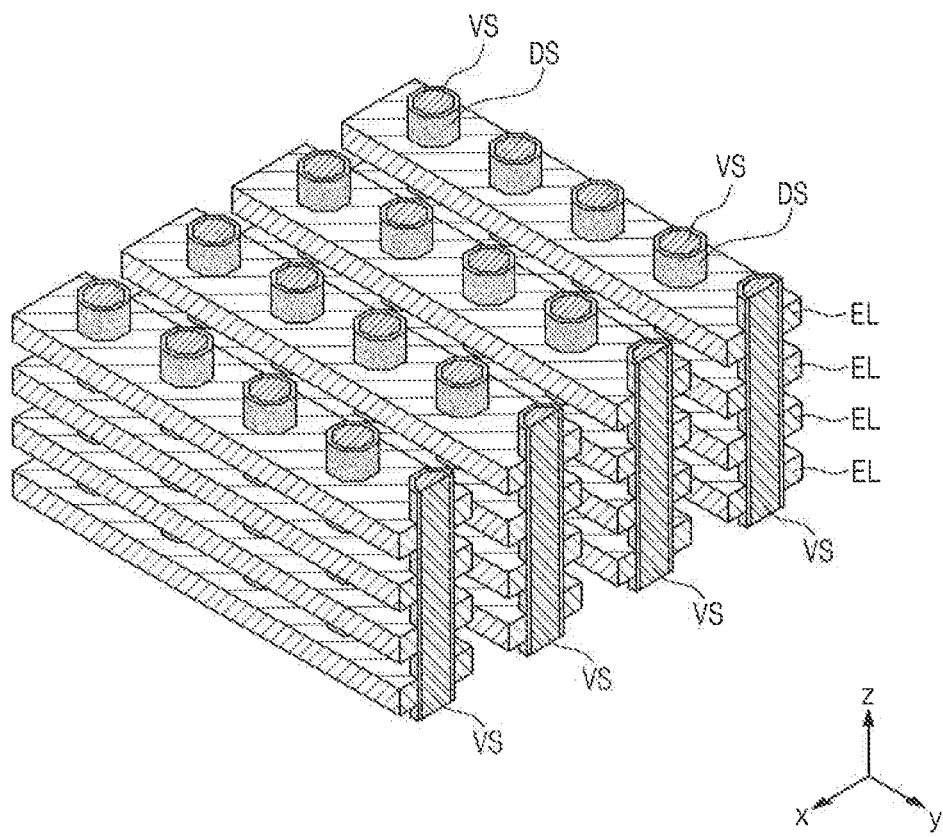
Figure 14:
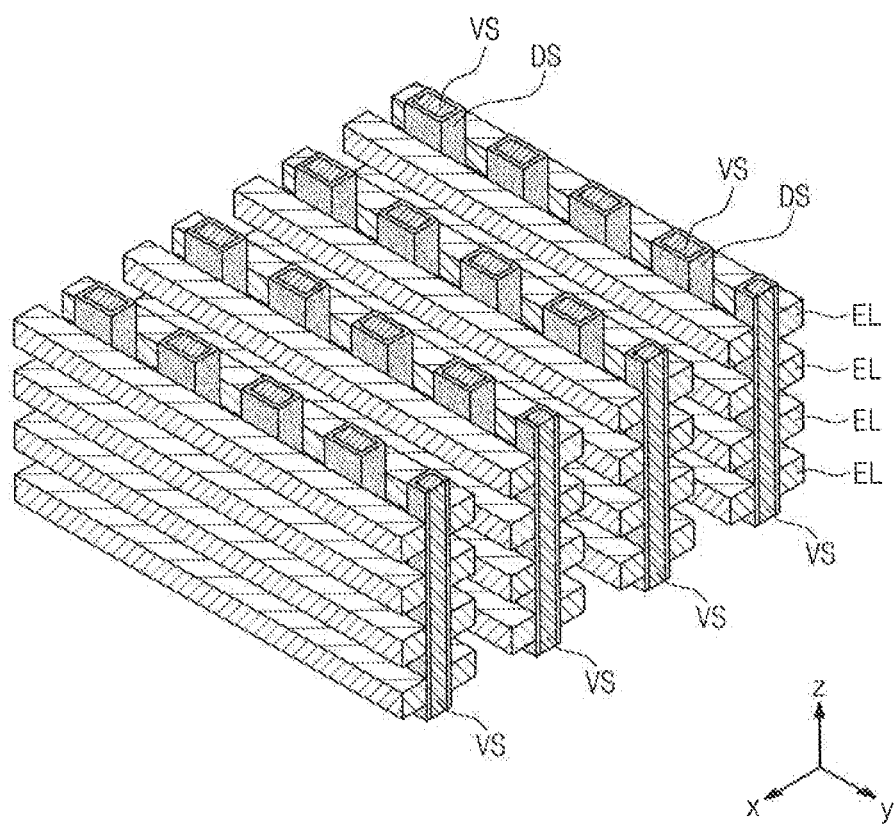

FIGS. 12 through 14 are perspective views illustrating a cell array structure of a three-dimensional semiconductor device according to an exemplary embodiment of the inventive concept.

The cell array structure may include a plurality of horizontal electrodes EL located at different levels from the substrate and parallel to each other, and a plurality of vertical structures VS extending perpendicular to the horizontal electrodes EL. The cell array structure further includes data storing patterns DS interposed between sidewalls of the horizontal electrodes EL and the vertical structures VS. The horizontal electrodes EL of FIGS. 12 through 14 may serve as the word lines WL0-WL3 (e.g., of FIG. 9) or WL (e.g., of FIG. 10) described with reference to FIGS. 9 and 10.

Referring to FIG. 12, each of the horizontal electrodes EL has a plate shape. The plate shape of the horizontal electrodes EL may have ten or more times greater than a diameter of vertical structures VS. The vertical structures VS are two-dimensionally arranged, penetrating the horizontal electrodes EL. For example, the vertical structures VS penetrate the horizontal electrodes EL that are disposed at levels different from each other.

Referring to FIG. 13, the horizontal electrodes EL are three-dimensionally arranged. Each of the horizontal electrodes EL has a line shape crossing vertical structures VS. For example, each horizontal electrode EL is greater than each vertical structure VS in width. The vertical structures VS penetrate the horizontal electrodes EL that are disposed at levels different from each other.

Referring to FIG. 14, horizontal electrodes EL are three-dimensionally arranged, and each horizontal electrode EL has a line shape extended in a first direction. A plurality of vertical structures VS has a pillar structure, extending in. a second direction crossing the first direction. Each vertical structure VS is interposed between a pair of two horizontal electrodes EL. For example, a pair of two horizontal electrodes is horizontally separated from each other to define a slit, and each vertical structure VS is disposed in the slit. For example, a pair of the horizontal electrodes EL disposed at both sides of each of the vertical structures VS is horizontally separated from each other, and each horizontal electrode of the pair of the horizontal electrodes EL may have an electric potential different form each other. Although not shown on the drawings, one of the pair of horizontal electrodes EL may be connected to an external circuit via a left-end portion thereof, while the other may be connected to other external circuit via a right-end portion thereof.

Alternatively, the pair of the horizontal electrodes EL may be electrically connected to each other to have an equipotential state.

Figure 15:
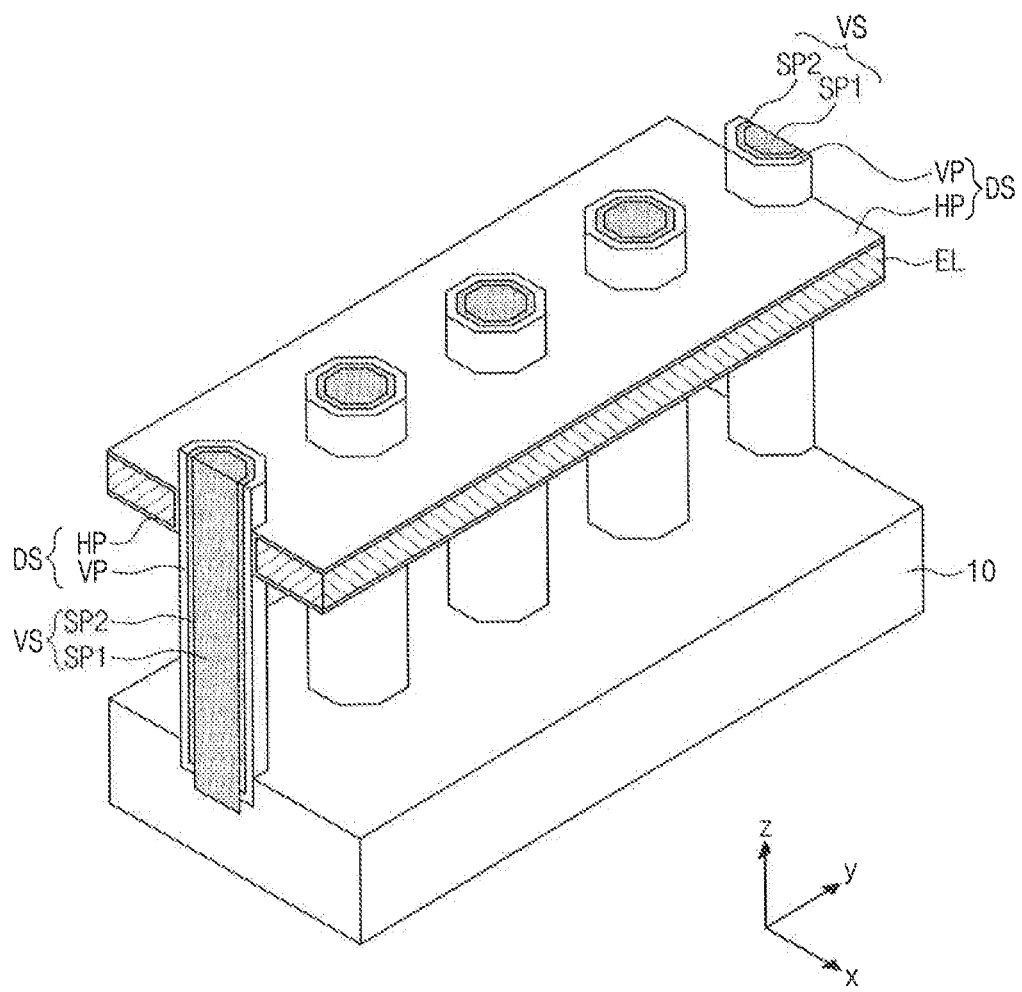

Referring to FIG. 15, a vertical structure VS includes a semiconductor body portion SP1 connected to a semiconductor substrate 10 and a semiconductor spacer SP2 interposed between the semiconductor body portion SP1 and a data storing layer DS.

Referring back to FIG. 9, each cell string CSTR includes a semiconductor pattern (e.g., the vertical structure VS) vertically extending from the common source line CSL and thereby being connected to one of the bit line BL0-BL3. The data storing layer DS may be provided between the word lines WL0-WL3 and the semiconductor pattern (e.g., the vertical structure VS). For example, the data storing layer DS may include a material to store electric charges. For example, the data storing layer DS may include one of an insulating layer with many trap sites (e.g., a silicon nitride layer), a floating gate electrode, or an insulating layer provided with conductive nano dots. Data to be stored in the data storing layer DS may be changed by using a Fowler-Nordheim (FN) tunneling effect or a difference between voltages applied to the vertical structure VS and the word lines WL0-WL3. For example, the data storing layer DS may include a phase-changeable material or a variable-resistance material.

Referring back to FIG. 15, the data storing layer DS includes a vertical pattern VP penetrating the horizontal electrodes EL and a horizontal pattern HP covering top and bottom surfaces of the horizontal electrodes EL.

Figure 16:
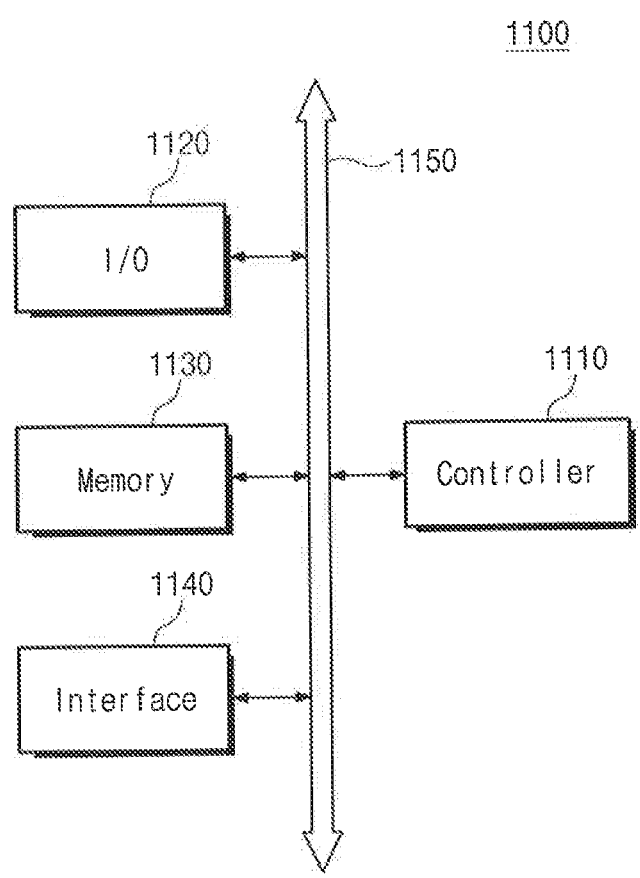
FIG. 16 is a block diagram illustrating a memory system including a three-dimensional semiconductor memory device according to an exemplary embodiment of the inventive concept.

FIG. 16 is a block diagram illustrating a memory system including a three-dimensional semiconductor memory device according to an exemplary embodiment of the inventive concept. The memory system may be employed by a PDA (personal digital assistant), a portable computer, a web tablet, a wireless phone, a mobile phone, a digital music player, a memory card and/or other devices that transmit and/or receive data in a wireless communication environment.

Referring to FIG. 16, the memory system 1100 includes a controller 1110, an input/output device 1120 (e.g., a keypad and/or a display device), a memory 1130, an interface 1140 and a bus 1150. The memory 1130 and the interface 1140 communicates with each other through the bus 1150.

The controller 1110 may include a microprocessor, a digital signal processor, a micro controller and/or other process devices similar to the microprocessor, the digital signal processor and the micro controller. The memory 1130 may be used to store an instruction executed by the controller 1110. The input/output device 1120 may receive data and/or a signal from the outside of the system 1100 and/or transmit data and/or a signal to the outside of the system 1100. For example, the input/output device 1120 may include a keyboard, a keypad and/or a displayer.

The memory 1130 may include a three-dimensional semiconductor memory device according to an exemplary embodiment of the inventive concept. The memory 1130 may include various kinds of memories such as volatile memories and/or non-volatile memories.

The interface 1140 may transmit data to a communication network and/or may receive data from a communication network.

Figure 17:
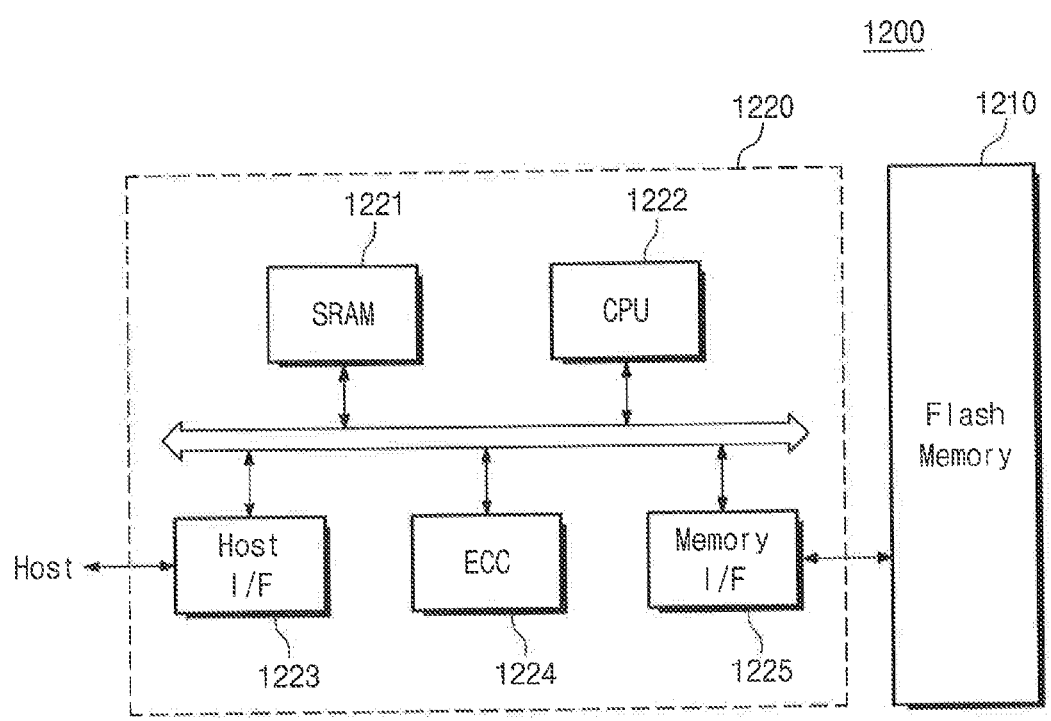
FIG. 17 is a block diagram illustrating a memory card including a three-dimensional semiconductor memory device according to an exemplary embodiment of the inventive concept.

FIG. 17 is a block diagram illustrating a memory card including a three-dimensional semiconductor memory device according to an exemplary embodiment of the inventive concept.

Referring to FIG. 17, a memory card 1200 may more a large amount of data by employing a semiconductor memory device 1210 according to an exemplary embodiment of the inventive concept. The memory card 1200 includes a memory controller 1220 interfacing a data exchange process between a host and the semiconductor memory device 1210.

The memory card 1200 includes a processing unit 1222 and a static random access memory (SRAM) device. The memory controller 1220 include a host interface 1223 employing data exchange protocols between a host and the memory card 1200. The memory controller 1220 includes an error correction block 1224 to detect and/or correct errors of data that is read out from the semiconductor memory device 1210. A memory interface 1225 may interface with the semiconductor memory device 1210. The processing unit 1222 may control operations for exchanging data of the memory controller 1220. The memory card 1200 may include a ROM (not illustrated) to store code data for the CPU.

Figure 18:
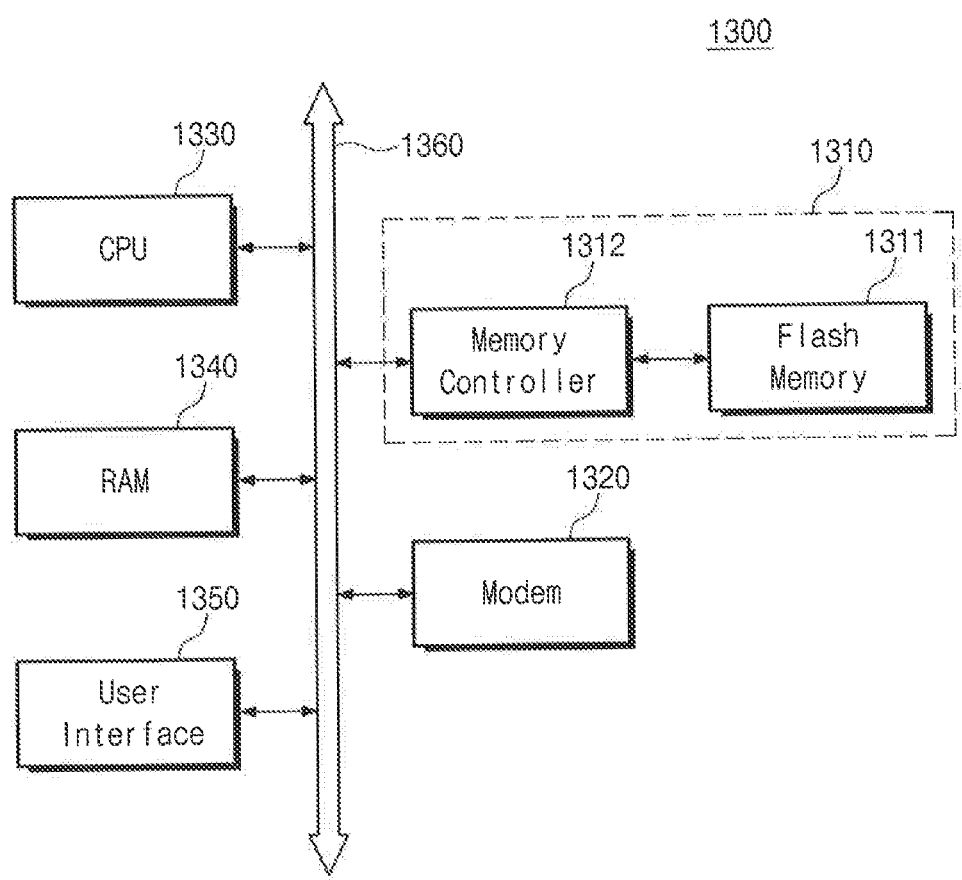
FIG. 18 is a schematic block diagram illustrating an information processing system including a three-dimensional semiconductor memory devices according to an exemplary embodiment of the inventive concept.

FIG. 18 is a block diagram illustrating an information processing systems including a three-dimensional semiconductor memory device according to an exemplary embodiment of the inventive concept.

Referring to FIG. 18, an information processing system 1300 includes a 3D semiconductor memory system 1310 including a 3D semiconductor memory device according to an exemplary embodiment of the inventive concept. The information processing system may include, for example, a mobile device and/or a desktop computer. The information processing system 1300 also includes a modem 1320, a central processing unit (CPU) 1330, a RAM 1340, and a user interface 1350, that are electrically connected to a system bus 1360. The semiconductor memory system 1310 includes a 3D semiconductor memory device 1311, and a memory controller 1312. A memory system 1310 may be a solid state drive (SSD), and data that may be processed by the CPU 1330 and/or input from the outside may be stored in the SSD. The information processing system 1300 configured as described and including a 3D semiconductor memory device may reliably store a large amount of data in the semiconductor memory system 1310. The semiconductor memory system 1310 may include resources for error correction and a high speed data exchange function. The information processing system. 1300 may also include an application chipset, a camera image processor (CIS) and/or an input/output device.

Furthermore, a semiconductor memory device and/or memory system that may include the same may be packaged in various kinds. For instance, the semiconductor memory device and/or memory system may be employed in a Package on Package (PoP), Ball Grid Array (BGA), Chip Scale Package (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP).

According to an exemplary embodiment of the inventive concept, an exposure process may be performed using a photo mask with a plurality of transmission regions whose optical transmittance are different from each other. Such exposure process may form a photoresist pattern having a staircase structure.

Further, an anisotropic etching process may be performed using the photoresist pattern on an etch-target layer one or more times, and thus, it is possible to form patterns having a staircase structure.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of fabricating a semiconductor device, comprising:
    forming an etch-target layer on a substrate;
    forming a photoresist layer on the etch-target layer;
    performing a first exposure process using a first photo mask to form a plurality of first-irradiated patterns in the photoresist layer, wherein the first photo mask includes a plurality of first transmission regions, each first transmission region having different optical transmittance;
    performing a second exposure process using a second photo mask to form a plurality of second-irradiated patterns in the photoresist layer, wherein the second photo mask includes a plurality of second transmission regions, each second transmission region having different optical transmittance;
    forming a photoresist pattern from the photoresist layer by removing the plurality of first-irradiated and second-irradiated patterns from the photoresist layer; and
    forming a lower structure from the etch-target layer by etching the etch-target layer using the photoresist pattern.

2. The method of claim 1, wherein each second transmission region of the second photo mask has optical transmittance different from each first transmission region of the first photo mask.

3. The method of claim 1, wherein each first-irradiated pattern and each second-irradiated pattern are alternately arranged in increasing height.

4. The method of claim 1, wherein the plurality of first transmission regions is spaced apart from each other.

5. The method of claim 1, wherein the first photo mask comprises a mask substrate and light-blocking patterns, wherein each first transmission region corresponds to a portion of the mask substrate defined by the light-blocking patterns, wherein each first transmission region is different in thickness of the mask substrate.

6. The method of claim 1, wherein each first transmission region has a first width, and each second transmission region has a second width different from the first width.

7. The method of claim 1, wherein each first transmission region is doped with impurities at a different impurity concentration.

8. The method of claim 1, wherein the photoresist pattern includes a stepwise surface.

9. The method of claim 1, wherein the photoresist layer is thicker than the etch-target layer.

10. The method of claim 1, wherein the etch-target layer comprises horizontal layers and interlayered insulating layers that are alternately stacked on the substrate, and
    wherein the forming of the lower structure comprises performing a single anisotropic etching process on the etch-target layer to form a staircase portion,
    wherein the performing of the single anisotropic etching process forms end portions of the horizontal layers and end portions of the interlayered insulating layers that constitute the staircase portion.

11. A method of fabricating a semiconductor device, comprising:
    forming an etch-target layer on a substrate;
    forming a photoresist layer on the etch-target layer;
    performing a first exposure process on the photoresist layer using a first photo mask to form a plurality of first-irradiated patterns in the photoresist layer, wherein each first-irradiated pattern is different in height;
    performing a second exposure process on the photoresist layer using a second photo mask to form a plurality of second-irradiated patterns, wherein each second-irradiated pattern is different in height, wherein each first-irradiated pattern and each second-irradiated pattern are alternately arranged;
    forming a photoresist pattern from the photoresist layer by removing the plurality of first-irradiated and second-irradiated patterns from the photoresist layer; and
    forming a lower structure from the etch-target layer by etching the etch-target layer using the photoresist pattern.

12. The method of claim 11, wherein the first photo mask comprises a plurality of first transmission regions, each first transmission region having different optical transmittance, and
    the second photo mask comprises a plurality of second transmission regions, each second transmission region having different optical transmittance.

13. The method of claim 11, wherein the photoresist pattern has a thickness decreasing in a stepwise manner with increasing distance from a central region of the photoresist pattern.

14. The method of claim 11, wherein the photoresist layer is thicker than the etch-target layer.

15. The method of claim 11, wherein the etch-target layer comprises a plurality of horizontal layers and a plurality of interlayered insulating layers, wherein each horizontal layer and each interlayered insulating layer are alternately stacked on the substrate,
- wherein the forming of the lower structure comprises performing a single anisotropic etching process on the etch-target layer to form the lower structure having a staircase portion,
- wherein end portions of the horizontal layers and end portions of the interlayered insulating layers are configured to form the staircase portion of the lower structure.

\* \* \* \* \*